(12) United States Patent
Helander et al.

(10) Patent No.: US 11,730,048 B2
(45) Date of Patent: Aug. 15, 2023

(54) METHOD FOR SELECTIVELY DEPOSITING A CONDUCTIVE COATING OVER A PATTERNING COATING AND DEVICE INCLUDING A CONDUCTIVE COATING

(71) Applicant: OTI Lumionics Inc., Toronto (CA)

(72) Inventors: Michael Helander, Toronto (CA); Zhibin Wang, Toronto (CA); Jacky Qiu, Toronto (CA)

(73) Assignee: OTI Lumionic Inc., Mississauga (CA)

( * ) Notice: Subject to any disclaimer, the term of this patent is extended or adjusted under 35 U.S.C. 154(b) by 94 days.

(21) Appl. No.: 17/318,897

(22) Filed: May 12, 2021

(65) Prior Publication Data

US 2021/0280789 A1    Sep. 9, 2021

Related U.S. Application Data

(63) Continuation of application No. 16/613,779, filed as application No. PCT/IB2018/053499 on May 17, 2018, now Pat. No. 11,043,636.

(60) Provisional application No. 62/507,760, filed on May 17, 2017, provisional application No. 62/515,432, filed on Jun. 5, 2017.

(51) Int. Cl.
*H10K 71/00* (2023.01)
*H10K 50/824* (2023.01)
*H10K 50/828* (2023.01)
*H10K 71/40* (2023.01)
*H10K 102/00* (2023.01)

(52) U.S. Cl.
CPC ......... *H10K 71/621* (2023.02); *H10K 50/824* (2023.02); *H10K 50/828* (2023.02); *H10K 71/421* (2023.02); *H10K 2102/3026* (2023.02)

(58) Field of Classification Search
CPC ............. H01L 51/0023; H01L 51/0027; H01L 51/5228; H01L 51/5234; H01L 2251/5315; H10K 71/00; H10K 71/40; H10K 50/824; H10K 50/828; H10K 102/00
USPC .......................................................... 257/40
See application file for complete search history.

(56) References Cited

U.S. PATENT DOCUMENTS

| | | |
|---|---|---|
| 4,022,928 A | 5/1977 | Piwcyzk |
| 4,137,293 A | 1/1979 | Nagata et al. |
| 5,399,936 A | 3/1995 | Namiki et al. |
| 6,016,033 A | 1/2000 | Jones et al. |

(Continued)

FOREIGN PATENT DOCUMENTS

| | | |
|---|---|---|
| CA | 2890253 A1 | 5/2014 |
| CA | 3002752 A1 | 5/2017 |

(Continued)

OTHER PUBLICATIONS

"An Introduction to Thin Films", Year 1976, pp. 13.
(Continued)

*Primary Examiner* — Tu-Tu V Ho
(74) *Attorney, Agent, or Firm* — Foley & Lardner LLP

(57) ABSTRACT

A device includes: (1) a substrate; (2) a patterning coating covering at least a portion of the substrate, the patterning coating including a first region and a second region; and (3) a conductive coating covering the second region of the patterning coating, wherein the first region has a first initial sticking probability for a material of the conductive coating, the second region has a second initial sticking probability for the material of the conductive coating, and the second initial sticking probability is different from the first initial sticking probability.

46 Claims, 22 Drawing Sheets

(56) References Cited

U.S. PATENT DOCUMENTS

| | | |
|---|---|---|
| 6,407,408 B1 | 6/2002 | Zhou et al. |
| 6,465,115 B2 | 10/2002 | Shi et al. |
| 6,538,374 B2 | 3/2003 | Hosokawa |
| 6,787,468 B2 | 9/2004 | Kim et al. |
| 6,835,950 B2 | 12/2004 | Brown et al. |
| 6,900,470 B2 | 5/2005 | Kobayashi et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,017,253 B2 | 9/2011 | Iizumi et al. |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,343,637 B2 | 1/2013 | Parham et al. |
| 8,362,469 B2 | 1/2013 | Suh |
| 8,679,647 B2 | 3/2014 | Pflumm et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,444,064 B2 | 9/2016 | Kaiser et al. |
| 9,450,027 B2 | 9/2016 | Pang et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,859,520 B2 | 1/2018 | Kim |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,270,033 B2 | 4/2019 | Chang et al. |
| 10,276,641 B2 | 4/2019 | Lou |
| 10,700,304 B2 | 6/2020 | Helander et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2006/0125390 A1 | 6/2006 | Oh |
| 2007/0059555 A1 | 3/2007 | Iizumi et al. |
| 2007/0077349 A1 | 4/2007 | Newman et al. |
| 2007/0148464 A1 | 6/2007 | Nishimura et al. |
| 2009/0199903 A1 | 8/2009 | Oyamada et al. |
| 2010/0078628 A1 | 4/2010 | Chi et al. |
| 2010/0089621 A1 | 4/2010 | Stoss et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0186820 A1 | 8/2011 | Kim et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2014/0070236 A1 | 3/2014 | Chen et al. |
| 2014/0110680 A1 | 4/2014 | Choe |
| 2014/0186983 A1 | 7/2014 | Kim et al. |
| 2014/0231761 A1 | 8/2014 | Kim et al. |
| 2014/0299866 A1 | 10/2014 | Ruske et al. |
| 2014/0353601 A1 | 12/2014 | Cho et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0287846 A1 | 10/2015 | Helander et al. |
| 2015/0376768 A1 | 12/2015 | Veres et al. |
| 2016/0013438 A1 | 1/2016 | Im et al. |
| 2016/0104859 A1 | 4/2016 | Kim et al. |
| 2016/0149156 A1 | 5/2016 | Kim et al. |
| 2016/0180763 A1 | 6/2016 | Park et al. |
| 2016/0211454 A1 | 7/2016 | Kim et al. |
| 2016/0293888 A1 | 10/2016 | Shim et al. |
| 2016/0351638 A1 | 12/2016 | Im et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0125495 A1 | 5/2017 | Lee et al. |
| 2017/0125506 A1 | 5/2017 | Kim |
| 2017/0155078 A1 | 6/2017 | Lee |
| 2017/0170246 A1 | 6/2017 | Im et al. |
| 2017/0186831 A1 | 6/2017 | Nam et al. |
| 2017/0317154 A1 | 11/2017 | Heo |
| 2017/0338438 A1 | 11/2017 | Kwon et al. |
| 2018/0006264 A1 | 1/2018 | Lee et al. |
| 2018/0040685 A1 | 2/2018 | Yeo et al. |
| 2018/0061323 A1 | 3/2018 | Kwon et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123078 A1 | 5/2018 | Byun et al. |
| 2018/0158881 A1 | 6/2018 | Lim et al. |
| 2018/0166518 A1 | 6/2018 | Kim |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0226581 A1 | 8/2018 | Chang et al. |

(56) References Cited

U.S. PATENT DOCUMENTS

| | | |
|---|---|---|
| 2018/0261797 A1 | 9/2018 | Lee |
| 2018/0294436 A1 | 10/2018 | Choi et al. |
| 2018/0297365 A1 | 10/2018 | Nakayama et al. |
| 2018/0309085 A1 | 10/2018 | Park et al. |
| 2018/0337219 A1 | 11/2018 | Rhee et al. |
| 2018/0366678 A1 | 12/2018 | Chi et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |

FOREIGN PATENT DOCUMENTS

| | | |
|---|---|---|
| CN | 101299419 A | 11/2008 |
| CN | 101617064 A | 12/2009 |
| CN | 101730938 A | 6/2010 |
| CN | 104037359 A | 9/2014 |
| CN | 104769149 A | 7/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106992267 A | 7/2017 |
| CN | 107564945 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110112182 A | 8/2019 |
| CN | 110144551 A | 8/2019 |
| CN | 110265474 A | 9/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| EP | 2 998 997 A1 | 3/2016 |
| EP | 3 182 477 A1 | 6/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 499 576 A1 | 6/2019 |
| JP | 2005-213623 | 8/2005 |
| JP | 2007-081102 | 3/2007 |
| JP | 2007-188854 A | 7/2007 |
| JP | 2010-258410 | 11/2010 |
| JP | 5233074 B2 | 7/2013 |
| JP | 2013-219278 A | 10/2013 |

(56) References Cited

FOREIGN PATENT DOCUMENTS

| | | |
|---|---|---|
| JP | 2016-048601 A | 4/2016 |
| KR | 1020100054630 A | 5/2010 |
| KR | 1020100123735 A | 11/2010 |
| KR | 1020140062258 A | 5/2014 |
| KR | 1020150127368 A | 11/2015 |
| KR | 101640772 B1 | 7/2016 |
| KR | 1020170030168 A | 3/2017 |
| KR | 1020170075865 A | 7/2017 |
| KR | 1020180115655 A | 10/2018 |
| KR | 1020180121304 A | 11/2018 |
| TW | 201929219 A | 7/2019 |
| WO | WO-2011/012212 A1 | 2/2011 |
| WO | WO-2011/049284 A1 | 4/2011 |
| WO | WO-2016/056364 A1 | 4/2016 |
| WO | WO-2017/043050 A | 3/2017 |
| WO | WO-2017/072678 A1 | 5/2017 |
| WO | WO-2018/206575 A1 | 11/2018 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/057208 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/191889 A1 | 10/2020 |
| WO | WO-2020/192051 A1 | 10/2020 |
| WO | WO-2020/199445 A1 | 10/2020 |
| WO | WO-2020/226383 A1 | 11/2020 |
| WO | WO-2020/261191 A1 | 12/2020 |

OTHER PUBLICATIONS

A. F., "Application of Molecular Amplification to Microcircuitry", Surface Physics Department, Year 1963, pp. 422-427.
Akio Amano et al., "Highly Transmissive One Side Emission OLED Panel for Novel Lighting Applications", SID 2013 Digest, Date Jul. 1, 2013, pp. 689-692.
Alexey I. Safonov et al., "Deposition of Thin Composite Films Consisting of Fluoropolymer and Silver Nanoparticles Having Surface Plasmon Resonance", Thin Solid Films 603, Date Feb. 18, 2016, pp. 4.
Amy V. Walker et al., "Dynamics of Interaction of Magnesium Atoms on Methoxy-Terminated Self-Assembled Monolayers: An Example of a Reactive Metal with a Low Sticking Probability", J. Phys. Chem. C, vol. 111, No. 2, Year 2007, pp. 765-772.
Bing Zhang et al., "A 17.3-inch WQHD Top-Emission Foldable AMOLED Display with Outstanding Optical Performance and Visual Effects" SID 2020 Digest, Sep. 25, 2020, pp. 1836-1839.
C.V. Bechtolsheim et al., "Interface Structure and Formation Between Gold and Trimethylcyclohexane Polycarbonate", J. Mater. Res., vol. 14, No. 9, Date Sep. 9, 1999, pp. 3538-3543.
Chan II Park et al., "World 1st Large Size 77-inch Transparent Flexible OLED Display", SID 2018 Digest, Date Apr. 29, 2018, pp. 710-713.
Chang-Jun Lee et al., "Microcavity Effect of Top-emission Organic Light-emitting Diodes Using Aluminum Cathode and Anode", Bull. Korean Chem. Soc. 2005, vol. 26, No. 9, Date Mar. 5, 2005, pp. 1344-1346.
Chia-Tse Lee et al., A Novel Highly Transparent 6-in. AMOLED Display Consisting of IGZO TFTs:, SID 2015 Digest, Jul. 29, 2015, pp. 872-875.
Ching Suet Ying et al., "Plasmonic Properties of Silver-based Alloy Thin Films", Date Feb. 2015, pp. 198.
Daiki Nakamura et al., "Top-emission OLED Kawara-type Multidisplay with Auxiliary Electrode", SID 2018 Digest, May 30, 2018, pp. 910-913.
Daimotsu Kato et al., "Transmissive One-Side-Emission OLED Panel using Alignment-Free Cathode Patterning", SID 2015 Digest, Date Jul. 29, 2015, pp. 790-793.
David S. Fryer et al., "Dependence of the Glass Transition Temperature of Polymer Films on Interfacial Energy and Thickness", Macromolecules 34, Date Apr. 6, 2001, pp. 5627-5634.
Dong-Youn Shin et al., "Self-patterning of fine metal electrodes by means of the formation of isolated silver nanoclusters embedded in polyaniline", Nanotechnology, Date Sep. 18, 2009, pp. 1-8.
F. Faupel et al., "Nucleation, growth, interdiffusion, and adhesion of metal films on polymers", American Institute of Physics, Date Mar. 19, 2008, pp. 201-216.
Fathi Aqra et al., "Surface free energy of alkali and transition metal nanoparticles", Applied Surface Science 314, Date Jul. 1, 2014, pp. 308-313.
Foreign Action other than Search Report on PCT PCT/IB2018/053499 dated Nov. 28, 2019.
Georg Hass et al., "Physics of Thin Films Advances in Research and Development vol. 2", Year 1964, pp. 455.
H. Eilersa et al., "Teflon AF/Ag Nanocomposites With Tailored Optical Properties", J. Mater. Res., vol. 21, No. 9, Date Sep. 9, 2006, pp. 2168-2171.
H. Song et al., "Modeling vapor deposition of metal/semiconductor-polymer nanocomposite", Thin Solid Films 476 (2005), Date Nov. 18, 2004, pp. 190-195.
Haewon Kiml et al., "Analysis of Semi-Transparent Cathode Performance Based on Fabrication Methods", Year 2019, pp. 906-909.
Hailiang Wang et al., "An Under-Display Camera Optical Structure for Full-Screen LCD", SID 2020 Digest, Date Sep. 25, 2020, pp. 1881-1882.
Hao Zhang et al., "A Design of Under-screen Face Recognition based on Screen Miniature Blind Apertures", SID 2020 Digest, Date Sep. 25, 2020, pp. 1878-1880.
Herbert Lifka et al., "P-169: Single Side Emitting Transparent OLED Lamp", SID 11 Digest, Date Aug. 16, 2012, pp. 1737-1739.
Hua Xu et al., "Transparent AMOLED Display Derived by Metal Oxide Thin Film Transistor with Praseodymium Doping", Date Jan. 14, 2019, pp. 557-559.
Hyun-Chang Kim et al., "A Method of Panel-Current Limitation for Automotive OLED Displays", SID 2020 Digest, Date Sep. 25, 2020, pp. 563-566.
Hywel T. Hopkin et al., "Solution-Processed Transparent Top Electrode for QD-LED", SID 2020 Digest, Date Sep. 25, 2020, pp. 516-519.
International Search Report and Written Opinion for International Patent Application No. PCT/IB2018/0523499, dated Aug. 28, 2018, 9 pages.
J. Kanzow et al., "Formation of a metal/epoxy resin interface", Applied Surface Science vol. 239, Issue 2, Date Jan. 15, 2005, pp. 227-236.
J. M. Flores-Camachol et al., "Growth and optical properties of Ag clusters deposited on poly(ethyleneterephthalate)", Nanotechnology 22, May 20, 2011, pp. 13.
James B. Heaney, "Evaluation of commercially supplied silver coated Teflon for Spacecraft Temperature Control Usage", Goddard Space Flight Center, Date Jan. 1974, pp. 34.
Jongwoong Park et al., "The Method to Compensate IR-Drop of AMOLED Display", SID 2019 Digest, Date May 29, 2019, pp. 81-84.
Jun Ho Yu et al., "Fabrication of Auxiliary Electrodes using Ag Inkjet Printing for OLED Lighting" SID 2018 DIGEST, Date May 30, 2018, pp. 843-846.

(56) References Cited

OTHER PUBLICATIONS

Jun-Yu Yang et al., "Amoled Ir Drop Compensation for Channel Length Modulation", SID 2020 Digest, Date Sep. 25, 2020, pp. 459-462.
K. L. Mittal et al., "Metallized Plastics 3: Fundamental and Applied Aspects", Plenum Press, New York, Year 1992, pp. 391.
Karina Morgenstern et al., "Decay of Two-Dimensional Ag Islands on Ag(111)", The American Physical Society, vol. 76, No. 12, Date Mar. 18, 1996, pp. 2113-2116.
Kisin, S., "Adhesion changes at metal-polymer interfaces : study of the copper-(acrylonitrile-butadiene-styrene) system", Eindhoven University of Technology, Jan. 1, 2007, pp. 143.
Kurt Frey et al., "Implications of coverage-dependent O adsorption for catalytic NO oxidation on the late transition metals", Catal. Sci. Technol., Date Aug. 4, 2014, pp. 4356-4365.
L. G. Lund et al., "Phosphonitrilic Derivatives. Part I. The Preparation of Cyclic and Linear Phosphonitrilic Chlorides.", Date Jan. 1, 1960, pp. 2542-2547.
L. Nittler et al., "Morphology study of small amounts of evaporated gold on polymers", Surf. Interface Anal., Date Feb. 24, 2012, pp. 1072-1075.
L. Vitos et al., "The surface energy of metals", Surface Science 411, Date May 2, 1998, pp. 186-202.
L.B. Knight et al., "Unusual Behavior of Vaporized Magnesium under Low Pressure Conditions", The Journal of Physical Chemistry. vol. 79, Year 1975, pp. 1183-1190.
Lei Zhao et al., "Patterning of Metal Films on Arbitrary Substrates by Using Polydopamine as a UV-Sensitive Catalytic Layer for Electroless Deposition", American Chemical Society, Date May 16, 2016, p. 5285-5290.
M. Scharnberg et al., "Radiotracer measurements as a sensitive tool for the detection of metal penetration in molecular-based organic electronics", Appl. Phys. Lett. 86, 024104, Date Jan. 5, 2005, pp. 4.
Marcel B. J. Meinders, "Effect of Surface Elasticity on Ostwald Ripening in Emulsions", American Chemical Society, Langmuir, vol. 17, No. 13, Date May 30, 2001, pp. 3923-3929.
Michael A. Fusellal et al., "Plasmonic Enhancement of Stability and Brightness in Organic Light-Emitting Devices", Nature, vol. 585, Date Sep. 16, 2020, pp. 379-387.
Michele Ricks et al., "Enabling Large-Size OLED Displays by Ink Jet Printing", OLEDs World Summit, Date Sep. 2020, pp. 28.
Milton Ohring, "The Materials Science of Thin Films", Year 1992, pp. 742.
Mingmin Shen et al., "Destabilization of Ag nanoislands on Ag(100) by dsorbed sulfur", J. Chem. Phys. 135, 154701, Date Oct. 17, 2011, pp. 10.
Neil Emerton et al., "Image Capture Through TFT Arrays", SID 2020 Digest, Date Sep. 25, 2020, pp. 402-405.
Norio Koma et al., "44.2: Novel Front-light System Using Fine-pitch Patterned OLED", SID 08 Digest, Date Jul. 5, 2012, pp. 655-658.
P.S. Ho et al., "Chemical bonding and reaction at metal/polymer interfaces", J. Vac. Sci. Technol. A Vacuum Surfaces and Films, Date Jun. 1985, pp. 739-745.
P.S. Ho, "Chemistry and Adhesion of Metal-Polymer Interfaces", Applied Surface Science, Date Apr. 5, 1989, pp. 559-566.
Paul Schissel et al., "Reactions at the Silver/Polymer Interface: A Review", Solar Energy Research Institute, Date Feb. 1980, pp. 52.
Quan Tang et al., "Study of the Image Blur through FFS LCD Panel Caused by Diffraction for Camera under Panel", SID 2020 Digest, Date Sep. 25, 2020, pp. 406-409.
Robert L.W. Smithson et al., "Effects of polymer substrate surface energy on nucleation and growth of evaporated gold films", Thin Solid Films 307, May 13, 1997, pp. 110-112.
Rokni Fard et al., "Biased Ostwald Ripening in Site-Selective Growth of Two-Dimensional Gold Clusters", Date Journal of Physical Chemistry C, vol. 122, No. 14, Year 2018, pp. 18.
Rong Jie Lin et al., "An Optimized Algorithm to Reconstruct the Structure of Transparent OLED Display Based on Monte Carlo Method", SID 2020 Digest, Date Sep. 25, 2020, pp. 2009-2012.

Sehoon Lim et al., "Image Restoration for Display-Integrated Camera", SID 2020 Digest, Date Sep. 26, 2020, pp. 1102-1105.
Seong Keun Kim et al., "High Efficiency Top-Emission Organic Light Emitting Diodes Realized Using Newly Developed Low Absorption Pure Ag cathode Configuration", SID 2019 Digest, Date May 29, 2019, pp. 50-53.
Seungin Baek et al., "Diffracted Image Retrieving with Deep Learning", SID 2020 Digest, Date Sep. 25, 2020, pp. 1106-1108.
Shiming Shi et al., "Research on Commercial Foldable AMOLED and Relevant Technologies", SID 2020 Digest, Date Sep. 25, 2020, pp. 826-829.
Shingo Eguchi et al., "Strategy for Developing an Ultra-High-Luminance AMOLED Display", SID 2018 Digest, Date May 30, 2018, pp. 433-436.
Silvia Varagnolo et al., "Embedded-Grid Silver Transparent Electrodes Fabricated by Selective Metal Condensation", J. Mater. Chem. C. 2020, Date Sep. 9, 2020, pp. 5.
Silvia Varagnolo et al., "Selective Deposition of Silver and Copper Films by Condensation Coefficient Modulation", The Royal Society of Chemistry, Year 2019, pp. 1-22.
Silvia Varagnolo et al., "Selective Deposition of Silver and Copper Films by Condensation Coefficient Modulation", The Royal Society of Chemistry 2020, Date Jul. 12, 2019, pp. 143-148.
Sven Murano et al., "AMOLED Manufacturing—Challenges and Solutions from a Material Makers Perspective", SID 2014 Digest, Date Jul. 7, 2014, pp. 403-406.
Tansel Karabacak, "Thin-film growth dynamics with shadowing and re-emission effects", Journal of Nanophotonics, vol. 5, Date Mar. 4, 2011, pp. 19.
Thran et al., "Condensation Coefficients of Ag on Polymers", The American Physical Society, vol. 82, No. 9, Date Mar. 1, 1999, pp. 1903-1906.
Tobias Schwab, "Improvement of the Light Extraction Efficiency and Optimization of Microcavity Effects for White Emission", Nov. 3, 2014, pp. 225.
Tohru Sonoda et al., "30-inch 4K Rollable OLED Display", SID 2020 Digest, Date Sep. 25, 2020, pp. 1261-1264.
Toshikazu Yamadal et al., "Nanoparticle chemisorption printing technique for conductive silver patterning with submicron resolution", N Nature Communications, Date Apr. 19, 2016, pp. 1-9.
Tsuyoshi Tsujioka et al., "Light-controlled metal deposition on photochromic polymer films", J. Mater. Chem.,vol. 20, Dates Jul. 22, 2010, pp. 9623-9627.
Tsuyoshi Tsujioka et al., "Metal-Vapor Deposition Modulation on Soft Polymer Surfaces", Appl. Phys. Express 5 021601, Date Feb. 8, 2012, pp. 4.
Tsuyoshi Tsujioka et al., Selective Metal Deposition on Photoswitchable Molecular Surfaces, J. Am. Chem. Soc. 130, Date Jul. 16, 2008, pp. 10740-10747.
V. G. Dubrovskii, "Fundamentals of Nucleation Theory", Nucleation Theory and Growth of Nanostructures, Year 2014, pp. 1-74.
V. Zaporojtchenko et al., "Controlled growth of nano-size metal clusters on polymers by using VPD method", Surface Science 532-535, Year 2003, pp. 300-305.
V. Zaporojtchenko et al., "Condensation coefficients of noble metals on polymers: a novel method of determination by x-ray photoelectron spectroscopy", Surf. Interface Anal. 30, Date Nov. 22, 1999, pp. 439-443.
V. Zaporojtchenko et al., "Determination of condensation coefficients of metals on polymer Surfaces", Surface Science 454-456, Year 2000, pp. 412-416.
V. Zaporojtchenko et al., "Formation of metal-polymer interfaces by metal evaporation: influence of deposition parameters and defects", Microelectronic Engineering 50, Year 2000, pp. 465-471.
V. Zaporojtchenko et al., "Metal/polymer Interfaces With Designed Morphologies", J. Adhesion Sci. Technol., vol. 14, No. 3, Date Apr. 2, 2012, pp. 25.
Veronica Satulu et al., "Combining Fluorinated Polymers with Ag Nanoparticles as a Route to Enhance Optical Properties of Composite Materials", Polymers, Date Jul. 23, 2020, pp. 1-13.
Wei Quan et al., "Transparent Conductive Hybrid Cathode Structure for Top-Emitting Organic Light-Emitting Devices", SID 2020 Digest, Date Sep. 25, 2020, pp. 1029-1032.

(56) References Cited

OTHER PUBLICATIONS

Wenfeng Song et al., "3-Stacked Top-Emitting White OLEDs with Super-Wide Color Gamut and High Efficiency", SID 2019 Digest, Date May 29, 2019, pp. 46-49.
Wolfgang Decker et al., "High Definition Metallization for Printed Electronics," Aimcal Fall Meeting 2011, Reno, NV, 11 pages.
Wolfgang Decker, "Selective Deposition of Metals on Polymer Films for Functional Applications", AIMCAL Fall Conference 2005, pp. 16.
Woo-Young Park et al., "High Efficiency Light Extraction from Top-Emitting Organic Light-Emitting Diodes Employing Mask-Free Plasma Etched Stochastic Polymer Surface", SID 2015 Digest, Date Mar. 1, 2016, pp. 1707-1709.
Xuan Zhao et al., "Color Shift Improvement of AMOLED Device with Color Filter", SID 2020 Digest, Date Sep. 25, 2020, pp. 2111-2112.
Y. Numata et al., "Highly transparent LCD using new scattering-type liquid crystal with field sequential color edge light," 2017 24th International Workshop on Active-Matrix Flatpanel Displays and Devices, pp. 1166-1169.
Yang Liu et al., "Top Emission WOLED for High Resolution OLED TV", SID 2018 Digest, Date May 30, 2018, pp. 1793-1795.
Yang Zeng et al., "Investigation of Moir? Interference in Pinhole Matrix Fingerprint on Display Technology", SID 2020 Digest, Date Sep. 25, 2020, pp. 413-416.
Yu-Hsiang Tsai et al., "A Flexible Transparent OLED Display with FlexUPTM Technology", SID 2017 Digest, Date Jun. 2, 2017, pp. 2021-2024.
Yu-Hung Chen et al., "High-Performance Large-size OLED TV with Ultra HD Resolution", SID 2015 Digest, Date Jul. 29, 2015, pp. 869-871.
Yunfei Liu et al., "High Transmittance Top Conductive Electrodes of OLEDs by Using Conductive Interface Layer", SID 2020 Digest, May 14, 2020, pp. 2087-2088.
Zhengyu Feng et al., "Pixel Design for Transparent MicroLED Display with Low Blurring", SID 2020 Digest, Date Sep. 25, 2020, pp. 410-412.
Zhenhua Zhang, "Image Deblurring of Camera Under Display by Deep Learning", SID 2020 Digest, Date Jul. 17, 2020, pp. 1109-1112.
Zhibin Wang et al., "Self-Assembled Cathode Patterning in AMOLED for Under-Display Camera", SID 2020 Digest, Date Sep. 25, 2020, pp. 906-909.
Zhibin Wang et al., "17-inch Transparent AMOLED Display With Self-Assembled Auxiliary Electrode", Date May 29, 2019, pp. 4.
Zhigiang Jiao et al., "Weakening Micro-Cavity Effects in White Top-Emitting WOLEDs with Semitransparent Metal Top Electrode", SID 2018 Digest, Date May 30, 2018, pp. 808-810.
Zhonguyuan Wu et al., "Development of 55inch 8K AMOLED TV by Inkjet Printing Process", SID 2020 Digest, Date Sep. 25, 2020, pp. 6.
Office Action on CN 201880044275.1 dated Jan. 26, 2022.
Office Action on JP 2019-563241 dated Mar. 10, 2022.
"Forrest, James A.""Reductions of the glass transition temperature in thin polymer films: Probing the length scale of cooperative dynamics."" Physical Review E 61.1 (2000): R53-6."
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Aqra, Fathi, and Ahmed Ayyad. "Surface free energy of alkali and transition metal nanoparticles." Applied surface science 314 (2014): 308-313.
Baek, Seungin, et al. "74-2: Diffracted Image Retrieving with Deep Learning."?SID Symposium Digest of Technical Papers. vol. 51. No. 1. 2020.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Chen, Yu-Hung, et al. "58.2: High-Performance Large-Size OLED Tv with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
David, Robert, Neumann, A. Wilhelm. "A Theory for the Surface Tensions and Contact Angles of HydrogenBonding Liquids." Langmuir 30.39 (2014):11634-11639.
Dubrovskii, Vladimir. "Fundamentals of Nucleation Theory." Nucleation Theory and Growth of Nanostructures. Springer, Berlin, Heidelberg, 2014. 1-73.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Emerton, Neil, David Ren, and Tim Large. "28-1: Image Capture Through TFT Arrays." SID Symposium Digest of Technical Papers. vol. 51. No. 1. 2020.
Faupel, F., et al. "Nucleation, growth, interdiffusion, and adhesion of metal films on polymers."?AIP Conference Proceedings. vol. 491. No. 1. American Institute of Physics, 1999.
Feng, Zhengyu, et al. "28-3: Pixel Design for Transparent MicroLED Display with Low Blurring."?SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Foreign Action other than Search Report on CN 201880044275.1 dated Aug. 4, 2022.
Foreign Action other than Search Report on JP 2019-563241 dated Sep. 28, 2022.
Fowkes, Frederick M. "Attractive Forces at Interfaces." Industrial and Engineering Chemistry 56.12 (1964): 40-52.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34.16 (2001): 5627-5634.
Fusella, Michael A., et al. "Plasmonic enhancement of stability and brightness in organic light-emitting devices." Nature 585.7825 (2020): 379-382.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning."?SID Symposium Digest of Technical Papers. vol. 46. No. 1. 2015.
Kim, Haewon, et al. "Analysis of Semi-Transparent Cathode Performance Based on Fabrication Methods." IDW'19. 2019.

(56) References Cited

OTHER PUBLICATIONS

Kim, Hyun-Chang, et al. "39-4: A Method of Panel-Current Limitation for Automotive OLED Displays."?SID Symposium Digest of Technical Papers. vol. 51. No. 1. 2020.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kisin, Srdjan.?Adhesion changes at metal-polymer interfaces: Study of the copper-(acrylonitrile-butadiene-styrene) system. Diss. Dissertation, Technische Universiteit Eindhoven, 2007.
Knight Jr, L. B., et al. "Unusual behavior of vaporized magnesium under low pressure conditions."?The Journal of Physical Chemistry? 79.12 (1975): 1183-1190.
Koma, N. et al. "44.2: Novel Front-light System Using Fine-pitch Patterned OLED." SID Symposium Digest of Technical Papers, 39: 655-658. 2008.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, Yang, et al. "p. 168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Lund, L. G., et al. "514. Phosphonitrilic derivatives. Part I. The preparation of cyclic and linear phosphonitrilic chlorides." Journal of the Chemical Society (Resumed) (1960): 2542-2547.
Maissel, Leon I., and Maurice H. Francombe. An introduction to thin films. CRC Press, 1973. pp. 61-83, 198, 199.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by InkJet Printing. OLEDs World Summit, Sep. 2020.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Murano, Sven, et al. "30.3: Invited Paper: AMOLED Manufacturing-Challenges and Solutions from a Material Makers Perspective."? SID Symposium Digest of Technical Papers. vol. 45. No. 1. 2014.
Nakamura, Daiki, et al. "68-4: Top-emission OLED Kawara-type Multidisplay with Auxiliary Electrode." SID Symposium Digest of Technical Papers. vol. 49. No. 1. 2018.
Nittier, Laurent, et al. "Morphology study of small amounts of evaporated gold on polymers." Surface and interface analysis 44.8 (2012): 1072-1075.
Ohring, Milton. Materials science of thin films. Elsevier, 2001.
Okuyama, Kentaro, et al.?"79-4L:?Late-News Paper: Highly Transparent LCD using New Scattering-type Liquid Crystal with Field Sequential Color Edge Light."?SID Symposium Digest of Technical Papers,?48, 2017.
Pandharkar, Riddhish, et al. "A Computational Study of AlF3 and ACF Surfaces." Inorganics 6.4 (2018): 124.
Park, Chan II, et al. "54-1: Distinguished Paper: World 1st Large Size 77-inch Transparent Flexible OLED Display."?SID Symposium Digest of Technical Papers. vol. 49. No. 1. 2018.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Peters, Richard D., et al. "Using Self-Assembled Monolayers Exposed to X-rays to Control the Wetting Behavior of Thin Films of Diblock Copolymers." Langmuir 16.10 (2000): 4625-4631.
Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Safonov, Alexey I., et al. "Deposition of thin composite films consisting of fluoropolymer and silver nanoparticles having surface plasmon resonance." Thin Solid Films 603 (2016): 313-316.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Shen, Mingmin, et al. "Destabilization of Ag nanoislands on Ag (100) by adsorbed sulfur." The Journal of chemical physics 135.15 (2011): 154701.
Shi, Shiming, et al. "56-1: Invited Paper: Research on Commercial Foldable AMOLED and Relevant Technologies."?SID Symposium Digest of Technical Papers. vol. 51. No. 1. 2020.
Shin, Dong-Youn, and Inyoung Kim. "Self-patterning of fine metal electrodes by means of the formation of isolated silver nanoclusters embedded in polyaniline."?Nanotechnology?20.41 (2009): 415301.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tarasevich, Y. I. "Surface energy of oxides and silicates." Theoretical and Experimental Chemistry 42 (2006): 145-161.

(56) References Cited

OTHER PUBLICATIONS

Thran, A., et al. "Condensation coefficients of Ag on polymers." Physical review letters 82.9 (1999): 1903.
Tsai, Yu-Hsiang, et al. "P-202: A Flexible Transparent OLED Display with FlexUPTM Technology."?SID Symposium Digest of Technical Papers. vol. 48. No. 1. 2017.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films."? Journal of Materials Chemistry?20.43 (2010): 9623-9627.
Varagnolo, Silvia, et al. "Embedded-grid silver transparent electrodes fabricated by selective metal condensation."?Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vitos, Levente, et al. "The surface energy of metals." Surface science 411.1-2 (1998): 186-202.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, Hailiang, et al. "P-132: An Under-Display Camera Optical Structure for Full-Screen LCD."?SID Symposium Digest of Technical Papers. vol. 51. No. 1. 2020.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Weimer, P. K. "Physics of Thin Films, vol. 2.". Academic Press, (1964).
Wolfgang Decker, Vast Films, Ltd. "Pattern Metallization: Selective Deposition of Metals on Polymer Films for Functional Applications" AIMCAL Fall Conference 2005.
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xu, Hua, et al. "Transparent AMOLED Display Derived by Metal Oxide Thin Film Transistor with Praseodymium Doping." Proceedings of the International Display Workshops vol. 26 (IDW'19). 2019.
Yamada, Toshikazu, et al. "Nanoparticle chemisorption printing technique for conductive silver patterning with submicron resolution." Nature communications 7.1 (2016): 1-9.
Yang, Jun-Yu, et al. "32-3: AMOLED IR Drop Compensation for Channel Length Modulation." SID Symposium Digest of Technical Papers. vol. 51. No. 1. 2020.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method."?Surface science?532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Zhenhua. "74-3: Image Deblurring of Camera Under Display by Deep Learning."?SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.

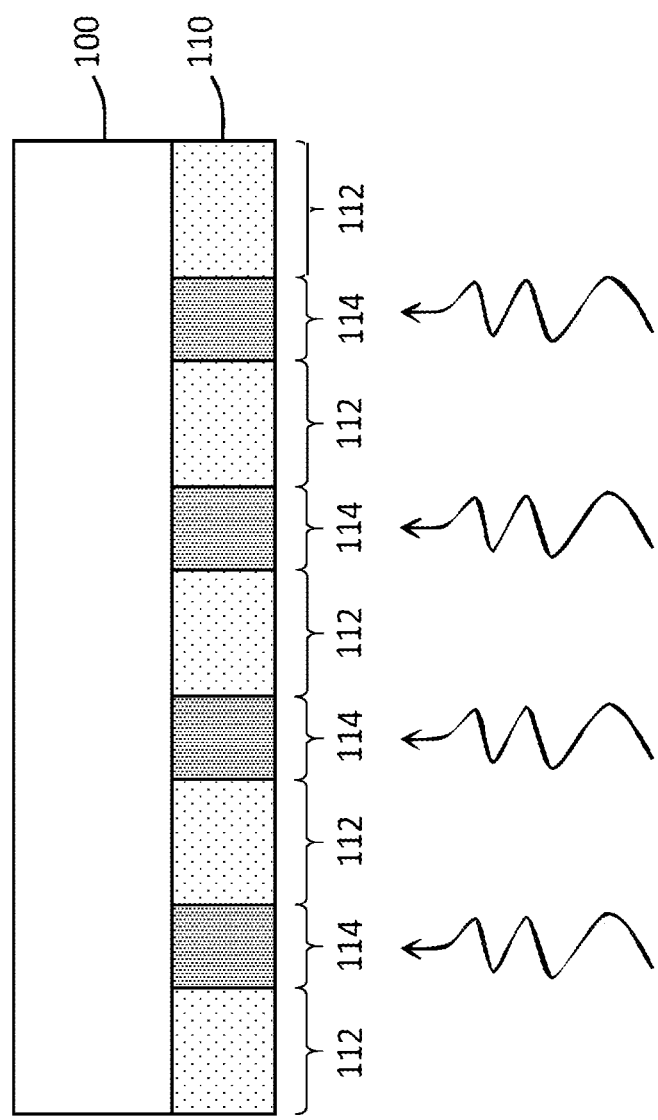

METHOD FOR SELECTIVELY DEPOSITING A CONDUCTIVE COATING OVER A PATTERNING COATING AND DEVICE INCLUDING A CONDUCTIVE COATING

CROSS REFERENCE TO RELATED APPLICATIONS

This application is a continuation of U.S. application Ser. No. 16/613,779 filed Nov. 14, 2019, which application is a 371 of PCT/IB2018/053499 filed May 17, 2018, which application claims the benefit of and priority to U.S. Provisional Application No. 62/507,760, filed May 17, 2017, and U.S. Provisional Application No. 62/515,432, filed Jun. 5, 2017, the contents of which are incorporated herein by reference in their entireties.

TECHNICAL FIELD

The following generally relates to a method for depositing a conductive coating on a surface. Specifically, the method relates to selective deposition of a conductive coating on a surface using a patterning coating.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is accompanied by an increase in its sheet resistance. An electrode with a high sheet resistance is generally undesirable for use in OLEDs, since it creates a large current-resistance (IR) drop when a device is in use, which is detrimental to the performance and efficiency of OLEDs. The IR drop can be compensated to some extent by increasing a power supply level; however, when the power supply level is increased for one pixel, voltages supplied to other components are also increased to maintain proper operation of the device, and thus is unfavorable.

In order to reduce power supply specifications for top-emission OLED devices, solutions have been proposed to form busbar structures or auxiliary electrodes on the devices. For example, such an auxiliary electrode may be formed by depositing a conductive coating in electrical communication with a transmissive electrode of an OLED device. Such an auxiliary electrode may allow current to be carried more effectively to various regions of the device by lowering a sheet resistance and an associated IR drop of the transmissive electrode.

During fabrication of thin-film opto-electronic devices, selective deposition of fine features is typically achieved by using a shadow mask in conjunction with a physical vapor deposition (PVD) process, such as evaporation. For example, devices such as OLEDs are typically fabricated by selectively depositing various materials such as emitters through apertures of a shadow mask. While such deposition process may be suitable for depositing organic materials, shadow mask deposition may be highly undesirable for depositing other materials such as metals. For example, since masks are typically metallic masks, they have a tendency to warp during a high-temperature deposition process, thereby distorting mask apertures and a resulting deposition pattern. Furthermore, a mask is typically degraded through successive depositions, as a deposited material adheres to the mask and obfuscates features of the mask. Consequently, such a mask either should be cleaned using time-consuming and expensive processes or should be disposed once the mask is deemed to be ineffective at producing a desired pattern, thereby rendering such process highly costly and complex. Accordingly, a shadow mask process may not be commercially feasible for depositing materials such as metals for mass production of OLED devices.

Another challenge of patterning a conductive coating onto a surface through a shadow mask is that certain, but not all, patterns can be achieved using a single mask. As each portion of the mask is physically supported, not all patterns are possible in a single processing stage. For example, where a pattern specifies an isolated feature, a single mask processing stage typically cannot be used to achieve the desired pattern. In addition, masks which are used to produce repeating structures (e.g., busbar structures or auxiliary electrodes) spread across an entire device surface include a large number of perforations or apertures formed on the masks. However, forming a large number of apertures on a mask can compromise the structural integrity of the mask, thus leading to significant warping or deformation of the mask during processing which can distort a pattern of deposited structures.

In addition to the above, shadow masks used for high-resolution patterning or patterning of fine features are generally expensive and a pattern (e.g., aperture size and layout) cannot be readily reconfigured or changed.

SUMMARY

According to some embodiments, a device includes: (1) a substrate; (2) a patterning coating covering at least a portion of the substrate, the patterning coating including a first region and a second region; and (3) a conductive coating covering the second region of the patterning coating, wherein the first region has a first initial sticking probability for a material of the conductive coating, the second region has a second initial sticking probability for the material of the conductive coating, and the second initial sticking probability is different from the first initial sticking probability.

According to some embodiments, a method of selectively depositing a conductive coating includes: (1) providing a substrate and a patterning coating covering a surface of the substrate; (2) treating the patterning coating to form a first region having a first initial sticking probability for a conductive coating material, and a second region having a second initial sticking probability for the conductive coating material; and (3) depositing the conductive coating material to form the conductive coating covering the second region of the patterning coating.

According to some embodiments, a method of manufacturing an opto-electronic device includes: (1) providing a substrate including an emissive region and a non-emissive region, the emissive region including: (i) a first electrode and a second electrode, and (ii) a semiconducting layer disposed between the first electrode and the second electrode; (2) depositing a patterning coating covering the emissive region and the non-emissive region; (3) treating a portion of the patterning coating covering the non-emissive region to increase an initial sticking probability of the treated portion of the patterning coating; and (4) depositing a conductive coating covering the non-emissive region.

BRIEF DESCRIPTION OF THE DRAWINGS

Some embodiments will now be described by way of example with reference to the appended drawings wherein:

FIG. 2A is a cross-sectional diagram illustrating a treatment of a patterning coating according to one embodiment;

DETAILED DESCRIPTION

Figure 1:
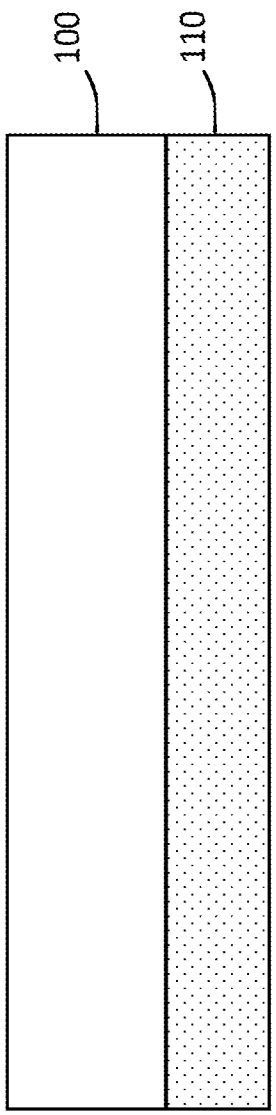
FIG. 1 is a cross-sectional diagram illustrating a patterning coating provided on a substrate surface according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

In one aspect according to some embodiments, a method for selectively depositing a conductive coating on a portion of a surface is provided. In some embodiments, the method is performed in the context of a manufacturing method of an opto-electronic device. In some embodiments, the method is performed in the context of a manufacturing method of another device. In some embodiments, the method includes depositing a patterning coating on a surface of a substrate. The method also includes treating the patterning coating to form a first region having a first initial sticking probability, and a second region having a second initial sticking probability. The conductive coating is then deposited to cover the second region of the patterning coating. In some embodiments, a material of the conductive coating includes magnesium. The second initial sticking probability may be higher than the first initial sticking probability. In some embodiments, treating the patterning coating includes subjecting the first region or the second region to an electromagnetic radiation. In some embodiments, the electromagnetic radiation is ultraviolet radiation or extreme ultraviolet radiation.

As used herein, a patterning coating refers to a coating or a layer of a material having a surface which, upon being treated, allows a material for forming a conductive coating (e.g., a conductive coating material) to be selectively deposited on a portion thereof. In some embodiments, the patterning coating may be formed by a patterning material, which, upon being treated, exhibits a different affinity towards deposition of the conductive coating material. For example, a patterning coating may exhibit a relatively low affinity towards deposition of the conductive coating material when the patterning coating is untreated, but may exhibit a relatively high affinity towards deposition of the conductive coating material upon being treated. In another example, a patterning coating may exhibit a relatively high affinity towards deposition of the conductive coating material when the patterning coating is untreated, but may exhibit a relatively low affinity towards deposition of the conductive coating material upon being treated. For example, the conductive coating material may be, or may include, a metallic material or a metal-based material.

One measure of affinity of a surface is an initial sticking probability of the surface for a material for forming a conductive coating, such as magnesium. For example, a region of a patterning coating exhibiting relatively low affinity with respect to the material for forming the conductive coating can refer to a region having a surface which exhibits a relatively low initial sticking probability for an evaporated flux of the conductive coating material, such that deposition of the conductive coating on the surface is inhibited due to nucleation inhibiting property of such region of the patterning coating. A region of the patterning coating exhibiting relatively high affinity with respect to the material for forming the conductive coating can refer to a region having a surface which exhibits a relatively high initial sticking probability for the evaporated flux of the conductive coating material, such that deposition of the conductive coating on the surface is relatively facilitated due to nucleation promoting property of such region of the patterning coating. As used herein, the terms "sticking probability" and "sticking coefficient" may be used interchangeably. Another measure of nucleation inhibiting or nucleation promoting property of a surface is an initial deposition rate of a metallic material, such as magnesium, on the surface relative to an initial deposition rate of the metallic material on another (reference) surface, where both surfaces are subjected or exposed to an evaporation flux of the metallic material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). Specifically regarding a conductive coating, one measure of an amount of a conductive coating material on a surface is a light transmittance, since electrically conductive materials, such as metals including magnesium, attenuate and/or absorb light. Accordingly, a surface can be deemed to be substantially free of an electrically conductive material if the light transmittance is greater than 90%, greater than 92%, greater than 95%, or greater than 98% in the visible portion of the electromagnetic spectrum. Another measure of an amount of a material on a surface is a percentage coverage of the surface by the material, such as where the surface can be deemed to be substantially free of the material if the percentage coverage by the material is no greater than 10%, no greater than 8%, no greater than 5%, no greater than 3%, or no greater than 1%. Surface coverage can be assessed using imaging techniques, such as using transmission electron microscopy, atomic force microscopy, or scanning electron microscopy.

As used herein, the term "crystallinity" refers to the degree of structural order which exists within a material. A crystalline material is generally a material exhibiting relatively high degree of structural order, and a non-crystalline or amorphous material is generally a material exhibiting relatively low degree of structural order.

FIG. 1 is a diagram illustrating a patterning coating 110 provided on a surface of a substrate 100 according to one embodiment. For example, the patterning coating 110 may be formed by a physical vapor deposition process (e.g., evaporation), a micro-contact transfer printing process, or other processes and techniques including but not limited to photolithography, printing (including ink or vapor jet printing and reel-to-reel printing), organic vapor phase deposition (OVPD), laser induced thermal imaging (LITI) patterning, and combinations thereof.

In FIG. 2A, portions of the patterning coating 110 is treated to produce a first region 112 (or a set of first regions 112) exhibiting a first affinity or first initial sticking coefficient towards deposition of a conductive coating material, and a second region 114 (or a set of second regions 114) exhibiting a second affinity or second initial sticking coefficient towards deposition of the conductive coating material which is different from the first affinity or first initial sticking coefficient. In the embodiment illustrated in FIG. 2A, the second region 114 is selectively treated to enhance or increase the affinity or initial sticking coefficient of the second region 114 relative to that of the first region 112. In other words, the second affinity or second initial sticking coefficient is greater than the first affinity or first initial sticking coefficient. For example, the second region 114 of the patterning coating 110 may be treated by selectively exposing the second region 114 to an electromagnetic radiation. The electromagnetic radiation may, for example, be ultraviolet (UV) radiation or extreme ultraviolet (EUV) radiation. For example, UV radiation may have a wavelength from about 10 nm to about 400 nm, and EUV radiation may have a wavelength from about 10 nm to about 124 nm. Additional examples of radiation wavelength include a wavelength of about 436 nm corresponding to g-line, a wavelength of about 405 nm corresponding to h-line, a wavelength of about 365 nm corresponding to i-line, a wavelength of about 248 nm corresponding to Krypton fluoride (KrF) lasers, a wavelength of about 193 nm corresponding to Argon fluoride (ArF) lasers, and a wavelength of about 13.5 nm corresponding to EUV light sources. An electromagnetic radiation having other wavelength(s) may be used in other examples. For example, a wavelength of the electromagnetic radiation may be from UV (e.g., about 10 nm) to microwave (e.g., about 1 m). For example, the wavelength of the electromagnetic radiation may be from about 10 nm to about 500 nm, from about 100 nm to about 500 nm, from about 200 nm to about 400 nm, from about 250 nm to about 390 nm, from about 300 nm to about 390 nm, or from about 320 nm to about 370 nm. In another example, treating the patterning coating 110 may include heating the patterning coating 110 or portions thereof to modify the affinity or initial sticking coefficient. For example, the second region 114 of the patterning coating 110 may be treated by localized heating or by being exposed to infrared (IR) radiation. The electromagnetic radiation for treating the patterning coating 110 may be provided, for example, by a laser. For example, the laser may be configured to emit an electromagnetic radiation having a wavelength from UV (e.g., about 10 nm) to microwave (e.g., about 1 m). It may be particularly advantageous in some applications to conduct the treatment of the patterning coating 110 using a laser, since a variety of different patterns may typically be achieved with little to no modification of an equipment set up. Furthermore, lasers such as single-frequency lasers typically have a relatively narrow linewidth, thus facilitating targeted and controlled modification of properties (e.g., affinity or initial sticking coefficient) of a treated region of the patterning coating 110. Additionally, a relatively small beam diameter may be achieved for many laser systems, thus allowing patterning of relatively fine features using such systems.

In other embodiments, the patterning coating 110 may be treated by subjecting a portion of the patterning coating 110 to ionizing radiation or bombardment of particles. For example, the patterning coating 110 may be treated by selectively bombarding a portion of the patterning coating 110 with energetic subatomic particles (including electrons), ions, and/or atoms. The particles may be provided as a collimated beam, or may be uncollimated. For example, the patterning coating 110 may be treated by selectively exposing portions of the patterning coating 110 to an electron beam. Referring to FIG. 2A, the second region 114 of the patterning coating may be subjected to an ionization radiation or bombardment of particles to modify the affinity or the initial sticking coefficient of the patterning coating 110 in the second region 114. For example, the affinity or the initial sticking probability of the second region 114 after the treatment may be higher than the affinity or the initial sticking coefficient of the untreated first region 112. Alternatively, in another example, the affinity or the initial sticking coefficient of the second region 114 after the treatment may be lower than the affinity or the initial sticking coefficient of the untreated first region 112.

Without wishing to be bound by a particular theory, it is postulated that subjecting the patterning coating 110 to a treatment may modify the patterning coating 110 to result in a different affinity towards deposition of a conductive coating material thereon.

For example, it has now been observed that, at least in some cases, a patterning coating having a relatively high crystallinity (or high degree of crystallinity) exhibits higher affinity towards deposition of a conductive coating material (e.g., substantially pure magnesium) compared to the patterning coating having a relatively low crystallinity (or low degree of crystallinity). Accordingly, in some embodiments, a patterning coating having a relatively low crystallinity may be provided on a surface of a substrate. The patterning coating may then be treated to increase the crystallinity in a treated region of the patterning coating. After being treated, the patterning coating may exhibit greater crystallinity in the treated region compared to an untreated region. The treated patterning coating may then be subjected to an evaporated flux of the conductive coating material to cause selective deposition of the conductive coating material over the treated region of the patterning coating. In some embodiments, the patterning coating may be non-crystalline or amorphous prior to treatment. In such embodiments, the patterning coating may be selectively treated to form crystalline regions, such that a conductive coating material may be selectively deposited on a crystalline region of the patterning coating, while inhibiting deposition of the conductive coating material on a non-crystalline or amorphous region of the patterning coating. Examples of treatments which may be used to modify the crystallinity include, but are not limited to, annealing (e.g., laser annealing), heating, exposure to electromagnetic radiation, and combinations thereof. For example, a region of the patterning coating may be treated by selectively heating the region above a patterning coating material's glass transition temperature ($T_g$). In a further example, the region may be gradually cooled to allow the material to crystallize at a controlled rate. In another example, a region of the patterning coating may be treated by selectively heating the region above the patterning coating material's melting temperature ($T_m$).

In another embodiment, a patterning coating having a relatively high crystallinity may be provided on a surface of a substrate. The patterning coating may then be treated to decrease the crystallinity in a treated region of the patterning coating. Accordingly, after the treatment, the patterning coating may exhibit lower crystallinity in the treated region compared to an untreated region. The treated patterning coating may then be subjected to an evaporated flux of a conductive coating material to cause selective deposition of the conductive coating material over the untreated region of the patterning coating. For example, the untreated region of the patterning coating may be substantially crystalline, and the treated region of the patterning coating may be substantially non-crystalline or amorphous.

While the above example has been described in relation to a patterning coating wherein the patterning coating exhibits higher affinity towards deposition of a conductive coating material when the crystallinity is relatively high, it will be appreciated that a similar process may be used to achieve selective deposition using a patterning coating wherein the patterning coating exhibits lower affinity towards deposition of a conductive coating material when the crystallinity is relatively high. In other examples, a treated region may exhibit lower affinity or initial sticking probability for deposition of the conductive coating material, thus resulting in selective deposition of the conductive coating material over untreated region of the patterning coating.

It has also been postulated that the presence of certain functional groups or terminal groups in a patterning coating material or compound may significantly affect the affinity or initial sticking coefficient of a patterning coating towards deposition of a conductive coating material. Accordingly, in some embodiments, a region or portion of the patterning coating may be treated to react or modify the patterning coating material.

In one example, a patterning coating having a surface with a relatively low affinity or initial sticking probability for deposition of a conductive coating material may be provided on a substrate surface. The patterning coating may then be treated to react or modify a patterning coating material in a treated region of the patterning coating, thus increasing the affinity or initial sticking coefficient of the patterning coating material in the treated region. For example, the patterning coating may be treated to physically or chemically modify the treated region of the patterning coating, thus increasing the affinity or initial sticking coefficient of the patterning coating. In this way, the patterning coating may be subjected to an evaporated flux of the conductive coating material to cause selective deposition of the conductive coating material over the treated region of the patterning coating.

In another example, a patterning coating having a surface with a relatively high affinity or initial sticking probability for deposition of a conductive coating material may be provided on a substrate surface. The patterning coating may then be treated to react or modify a patterning coating material in a treated region of the patterning coating, thus decreasing the affinity or initial sticking coefficient of the patterning coating material in the treated region. For example, the patterning coating may be treated to physically or chemically modify the treated region of the patterning coating, thus decreasing the affinity or initial sticking coefficient of the patterning coating. The treated patterning coating may then be subjected to an evaporated flux of the conductive coating material to cause selective deposition of the conductive coating material over an untreated region of the patterning coating.

Examples of treatments which may be used to react or modify the patterning coating material include, but are not limited to, heating, exposure to electromagnetic radiation or ionizing radiation, bombardment of particles such as electrons, exposure to plasma treatment, exposure to chemical sensitizing agent, and combinations thereof.

Without wishing to be bound by any particular theory, it is postulated that subjecting a patterning coating to electromagnetic radiation such as UV radiation or EUV radiation may cause a compound used to form the patterning coating to be reacted, thus removing or modifying certain functional groups or terminal groups present in such compound. For example, such treatment may cause dissociation of certain functional groups, terminal groups, or complex present in such compound. For example, an electromagnetic radiation may be used to break bonds (e.g., covalent, ionic, and/or dative bonds) of the compound, or react certain species or functional groups of the compound to cause a change in the affinity or initial sticking probability towards deposition of a conductive coating material. In another example, irradiating the compound may result in formation of additional bonds or incorporation of an additional atom or molecule into the compound (e.g., through reacting with another species or identical species), thus modifying the characteristics and the affinity of the patterning coating towards deposition of the conductive coating material. In yet another example, treating the patterning coating may cause a patterning coating material to cross-link, thus modifying the characteristics and properties of the patterning coating material. In yet another example, treating the patterning coating may cause monomers of a patterning coating material to polymerize, thus modifying the characteristics and properties of the patterning coating material. In yet another example, the patterning coating material may be cross-linked prior to treatment, and, by subjecting the material to treatment (e.g., irradiation by electromagnetic radiation), the material become uncross-linked, thus modifying the characteristics and properties of the patterning coating material. In a further example, uncross-linked materials may optionally be removed, for example by dissolving using a solvent or by plasma cleaning, prior to deposition of a conductive coating. In yet another example, treating the patterning coating may induce a change in conformation of the compound used to form such patterning coating. For example, treating the patterning coating may induce the compound forming the patterning coating to transition from a first conformer to a second conformer. The first conformer and the second confirmer may exhibit different affinity or initial sticking probability towards deposition of a conductive coating material. For example, such transition from a first conformer to a second conformer may be induced by treating the patterning coating by exposure to electromagnetic radiation, such as UV radiation for example.

It is further postulated that similar changes to a patterning coating material (e.g., breaking or forming bonds, cross-linking, and so forth) may be caused by other treatments including heating, ionizing radiation, and bombardment of particles. Furthermore, especially in embodiments where an ionizing radiation is used to treat a patterning coating, such treatment may cause electrons to be removed from atom(s) of a patterning coating material, thus modifying the affinity or initial sticking coefficient of the patterning coating.

Referring to FIG. 2A, the patterning coating 110 may be treated under various conditions and environments. For example, the patterning coating 110 may be treated in air, inert gas, in vacuum, or in the presence of a chemical sensitizing agent or other reactive agents. For example, the patterning coating 110 may be treated in the presence of oxygen and/or water, such as in air. In other examples, the patterning coating 110 may be treated in inert gas (such as, for example, nitrogen and/or argon environment) or in a vacuum (such as, for example, high vacuum or ultrahigh vacuum). In another example, the patterning coating 110 may be treated in the presence of a chemical sensitizing agent or a reactive species to cause a chemical reaction. Examples of such chemical sensitizing agents and reactive species include halogens such as fluorine, chlorine, bromine, and iodine, halogen-containing species, and volatile small molecules (which may be in a liquid or a gaseous form, for example).

It will be appreciated that, particularly in cases where the treatment is conducted by exposing a patterning coating to an electromagnetic radiation, the spectrum of the radiation may be tuned to produce the desired treatment effect. For example, particularly in the case of lasers, a wavelength of a radiation emitted by a laser may be tuned to match the energy to form or break particular bond(s) of a compound. More generally, the wavelength of an electromagnetic radiation used for treatment may be tuned to match the energy to induce a particular chemical reaction for modifying the initial sticking probability of the patterning coating in a treated region.

In some embodiments, a patterning coating includes a patterning coating material which absorbs light having certain wavelength(s). Specifically, the patterning coating material may exhibit molecular electronic transitions in which electrons are excitable from a first energy level to a second energy level, and the energy difference between the first energy level and the second energy level may correspond to the absorption wavelength. In some embodiments, the patterning coating may be treated by exposing the patterning coating to an electromagnetic radiation having a wavelength substantially corresponding to, or matching, the absorption wavelength of the patterning coating material. Without wishing to be bound by any particular theory, it is postulated that for a patterning coating formed by certain patterning coating materials, treating the patterning coating by exposing the patterning coating to an electromagnetic radiation having a wavelength substantially corresponding to the absorption wavelength of a patterning coating material in air may cause the patterning coating to undergo an oxidation reaction, thereby increasing the concentration of an oxygen species in a treated portion or region of the patterning coating. Examples of oxygen species include oxygen, hydroxyl group, and other species which includes or incorporates an oxygen atom. It has now been found that, at least for some patterning coating materials, the region of the patterning coating which has been treated and thus includes a higher concentration of an oxygen species may exhibit a higher affinity or initial sticking probability than an untreated region of the patterning coating. In some embodiments, the patterning coating includes or is formed by an organic material such as, for example, an organic compound. Without wishing to be bound by any particular theory, it is postulated that oxidation of the patterning coating through treatment causes certain oxygen species to chemically bond to a portion of the patterning coating material. For example, such oxygen species may chemically bond to a carbon atom of the patterning coating material, thus forming a C—O bond and/or a C—OH bond, for example. It is further postulated that the presence of such C—O bond and/or a C—OH bond, particularly when formed on a surface of the treated patterning coating, may increase the affinity or initial sticking probability of the patterning coating with respect to a material for forming a conductive coating. Accordingly, in some embodiments, the patterning coating includes, or is formed by, a patterning coating material which absorbs light having certain wavelength(s), such as for example UV radiation. For example, the patterning coating material may absorb light having a wavelength less than about 500 nm, less than about 450 nm, less than about 430 nm, less than about 420 nm, less than about 400 nm, less than about 390 nm, less than about 380 nm, less than about 370 nm, less than about 350 nm, or less than about 330 nm. For example, the patterning coating material may absorb light having a wavelength from about 300 nm to about 450 nm, from about 330 nm to about 430 nm, from about 350 nm to about 400 nm, or from about 350 nm to about 380 nm. As would be understood, the absorption wavelength of a material may be determined using analytical techniques such as ultraviolet-visible (UV-Vis) spectroscopy. In some embodiments, a patterning coating includes an aromatic compound which, upon being treated, chemically reacts such that oxygen species are chemically bonded to one or more carbon atoms forming an aromatic functional group of the compound. In some embodiments, a patterning coating includes polycyclic aromatic compounds.

In another example, a patterning coating may be treated to produce the patterning coating including a first region having a relatively low density of defects and a second region having a relatively high density of defects. For example, the second region may be treated to increase the density of defects on a surface of the patterning coating, while the first region may be left untreated. In another example, the first region may be treated to decrease the density of defects on the surface of the patterning coating, while the second region may be left untreated. For example, the density of surface defects may be characterized by measuring the surface roughness, and/or density of impurities present on the surface.

In some embodiments, a patterning coating includes two or more different materials. For example, the patterning coating may be formed by depositing two or more different materials, which upon being treated, react with one another to change the affinity or initial sticking coefficient of the patterning coating. The two or more different materials may be deposited as separate layers, or as a single layer formed by intermixing the two or more different materials. For example, treating a portion of such patterning coating may cause the materials to chemically react with one another, or cause the molecular structure of the material disposed at or proximal to a surface of the patterning coating to become reoriented, thus modifying the properties of the patterning coating. In some embodiments, an average molecular weight of a first material in a first region (having a lower affinity for a conductive coating material) of such patterning coating is different from an average molecular weight of a second material in a second region (having a greater affinity for the conductive coating material) of such patterning coating. In some embodiments, the average molecular weight of the first material is less than the average molecular weight of the second material, such as, for example, about 95% or less, about 90% or less, or about 85% or less.

In some embodiments, a patterning coating includes materials which self-assemble. For example, the patterning coating may include copolymers which self-assemble to result in a repeating pattern. Examples of such copolymers include, but are not limited to, block copolymers such as diblock copolymers and triblock copolymers. In some cases, a patterning coating material may self-assemble to form a repeating pattern upon being subjected to a treatment. Examples of such treatment include, for example, adjustment of the temperature and/or the pH. In other cases, the patterning coating material may self-assemble upon being deposited onto a surface, and thus may not be subjected to a treatment. As would be understood, the patterning coating formed by self-assembled materials may contain regions which exhibit different affinity or initial sticking coefficient with respect to deposition of a conductive coating material. Specifically, the patterning coating formed by self-assembly may exhibit a repeating pattern of regions with relatively low affinity or initial sticking coefficient disposed adjacent to regions with relatively high affinity or initial sticking coefficient.

In some embodiments, a patterning coating may be treated by removing a portion or region of the patterning coating to expose an underlying surface. For example, a portion of the patterning coating may be ablated to remove the material forming such portion of the patterning coating. In this way, the surface underlying the patterning coating may be exposed. Such exposed underlying surface may have a different affinity or initial sticking probability than the patterning coating, and thus selective deposition of a conductive coating may be conducted.

Figure 2B:
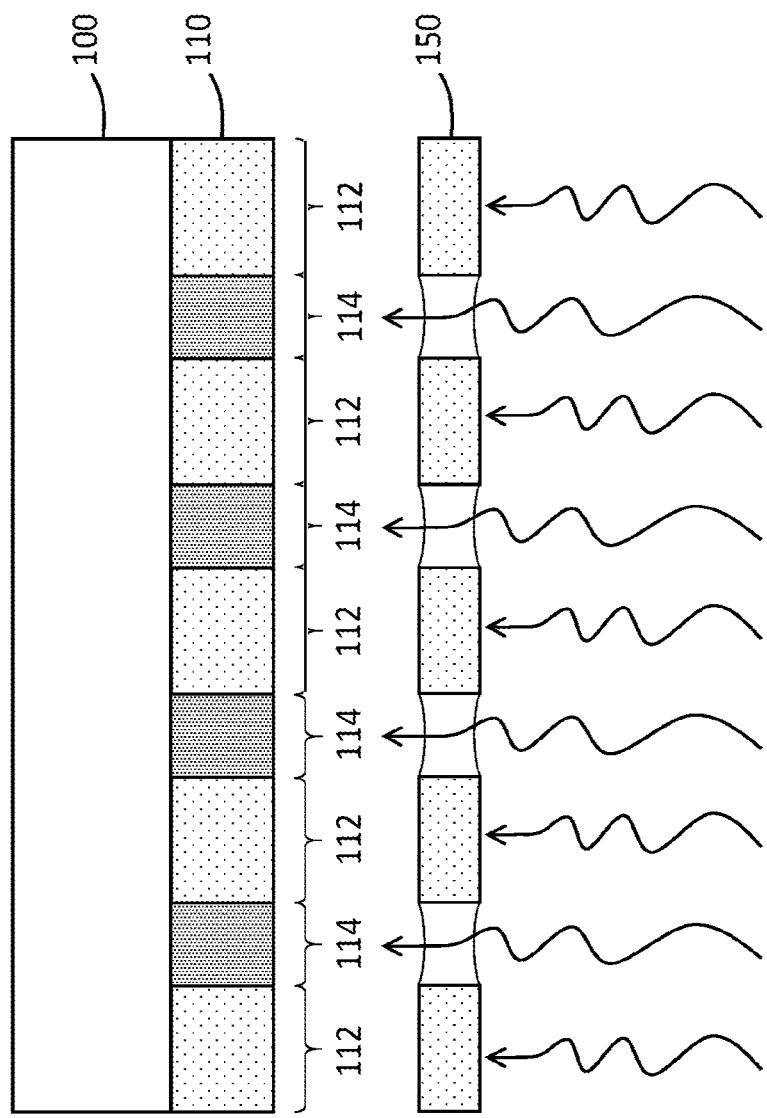
FIG. 2B is a cross-sectional diagram illustrating a treatment of a patterning coating according to another embodiment.

FIG. 2B illustrates a stage of treating the patterning coating 110 wherein a photomask 150 is used to selectively expose regions of the patterning coating 110. Specifically in FIG. 2B, the photomask 150 having a plurality of apertures is used to block or inhibit an electromagnetic radiation from being incident on the first region 112 of the patterning coating 110, while allowing passage of the electromagnetic radiation through the apertures to selectively treat the second region 114. In some embodiments, the photomask 150 may be in physical contact with a portion of the substrate and/or the patterning coating 110, such that there is substantially no gap provided between the photomask 150 and the surface of the patterning coating 110. In some embodiments, the photomask 150 and the surface of the patterning coating 110 may be spaced apart from one another such that the photomask 150 and the patterning coating 110 are not in physical contact with one another. In some embodiments, optical elements such as lens, reflectors, focusing elements, and/or mirrors may be used to project the pattern of the photomask 150 onto the patterning coating 110. For example, such optical elements may be arranged in the optical path of the electromagnetic radiation to transmit or reflect such radiation. In some embodiments, the photomask 150 may be a transmission-type photomask, which is configured to permit a portion of the light incident on the photomask 150 to be transmitted therethrough while inhibiting the remainder of light from being transmitted to produce a pattern. In some embodiments, the photomask 150 may be a reflection-type photomask, which is configured to reflect a portion of the light incident on the photomask 150 while inhibiting the remainder of the light from being reflected, thus producing a pattern. Various optical elements may be arranged between a light source and the photomask 150, and/or between the photomask 150 and the substrate 100. Other elements such as a pellicle and alignment systems may also be provided.

In embodiments wherein the patterning coating 110 is treated by exposure to ionization radiation and/or bombardment of particles (e.g., electrons), a similar mask as the one depicted in FIG. 2B may be used to selectively subject portions of the patterning coating 110 to such treatment.

Figure 3:
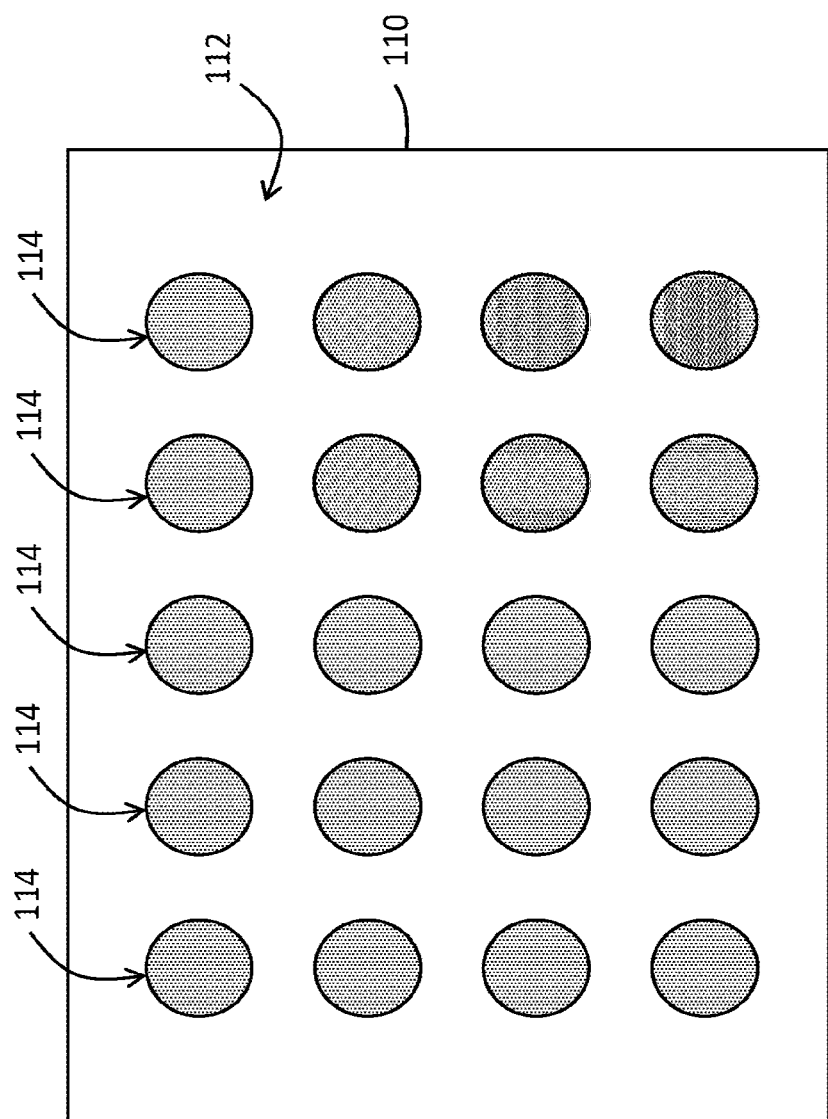
FIG. 3 is a diagram illustrating a top view of the treated patterning coating according to the embodiment of FIG. 2B.

FIG. 3 illustrates a top view of the treated patterning coating 110 following the stage illustrated in FIG. 2B. As illustrated, the second region 114 may be formed as a plurality of discrete regions (e.g., circular regions) that are separated from one another by the first region 112 that may be formed as a continuous region. It will be appreciated that, while the second region 114 is illustrated as being circular in shape in FIG. 3, the specific shape, size, and configuration of the second region 114 may vary depending on the photomask 150 and thus may be varied in other embodiments.

Figure 4:
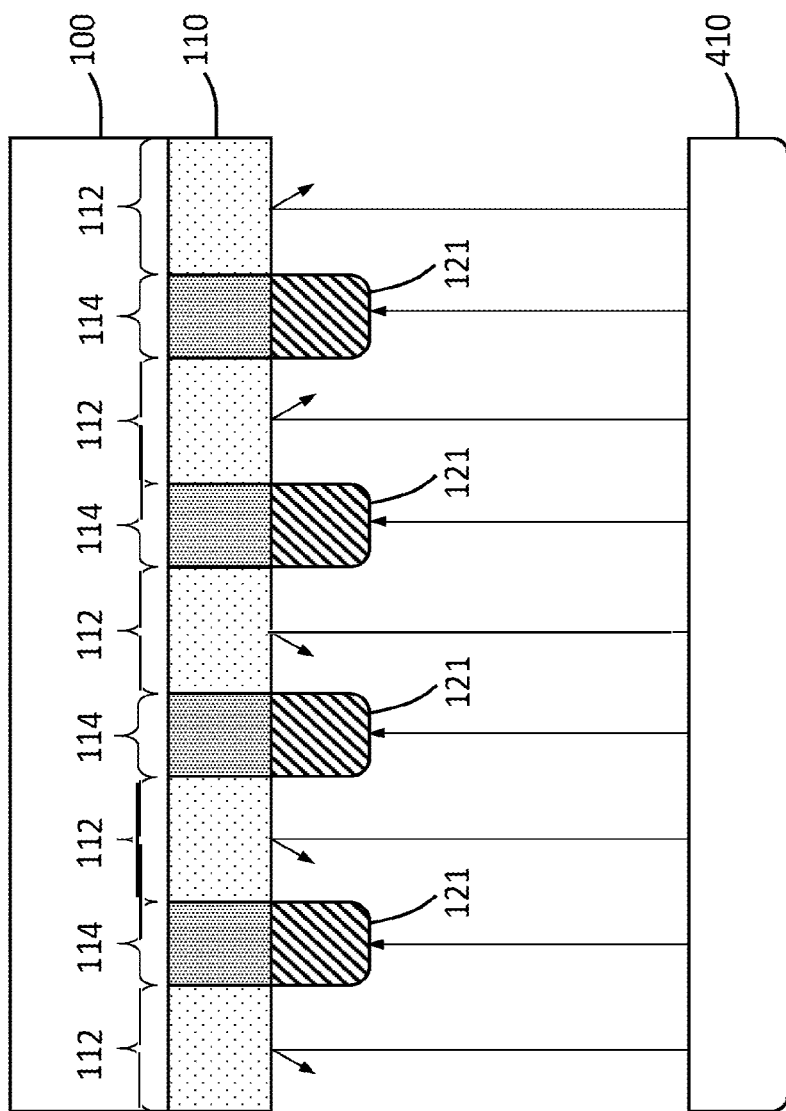
FIG. 4 is a schematic diagram illustrating the deposition of a conductive coating on the treated patterning coating of FIG. 3 according to one embodiment.
Figure 5:
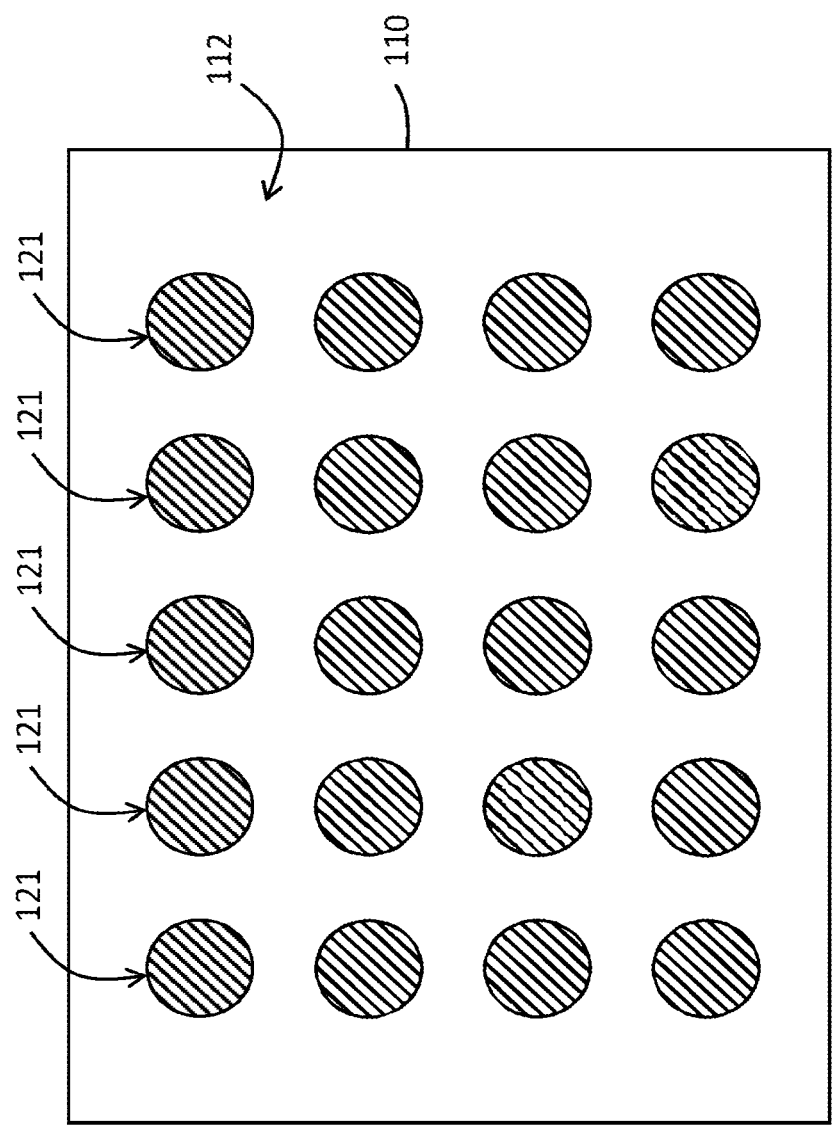
FIG. 5 is a diagram illustrating a top view of the treated patterning coating and the conductive coating according to the embodiment of FIG. 4.

Once the patterning coating 110 has been treated, the surface of the treated patterning coating 110 may be subjected to a vapor flux of an evaporated conductive coating material. FIG. 4 illustrates a stage of subjecting the treated patterning coating 110 to an evaporated flux to cause selective deposition of a conductive coating 121 thereon. As explained above, since the second region 114 exhibits higher affinity or initial sticking probability compared to the first region 112, the conductive coating 121 is selectively deposited over the second region 114 of the patterning coating 110. More specifically in FIG. 4, a metal source 410 directs the evaporated conductive coating material such that it is incident on both the first region 112 and the second region 114 of the patterning coating 110. However, since the first region 112 of the patterning coating 110 exhibits a relatively low initial sticking coefficient compared to that of the second region 114, the conductive coating 121 selectively deposits onto areas corresponding to the second region 114 of the patterning coating 110. This is further illustrated in FIG. 5, which shows a top view of a device following the stage of FIG. 4. In FIG. 5, the conductive coating 121 is deposited onto the areas corresponding to the second region 114 of the patterning coating 110, while the first region 112 is substantially free of the conductive coating material.

In some embodiments, the deposition of the patterning coating 110 and/or the conductive coating 121 may be conducted using an open-mask or mask-free deposition process.

It will be appreciated that an open mask used for deposition of any of various layers or coatings, including the patterning coating 110 and the conductive coating 121, may "mask" or prevent deposition of a material on certain regions of the substrate 100. However, unlike a fine metal mask (FMM) used to form relatively small features with a feature size on the order of tens of microns or smaller, a feature size of an open mask is generally comparable to the size of a device being manufactured. For example, the open mask may mask edges of a display device during manufacturing, which would result in the open mask having an aperture that approximately corresponds to a size of the display device (e.g., about 1 inch for micro-displays, about 4-6 inches for mobile displays, about 8-17 inches for laptop or tablet displays, and so forth). For example, the feature size of an open mask may be on the order of about 1 cm or greater.

Figure 6:
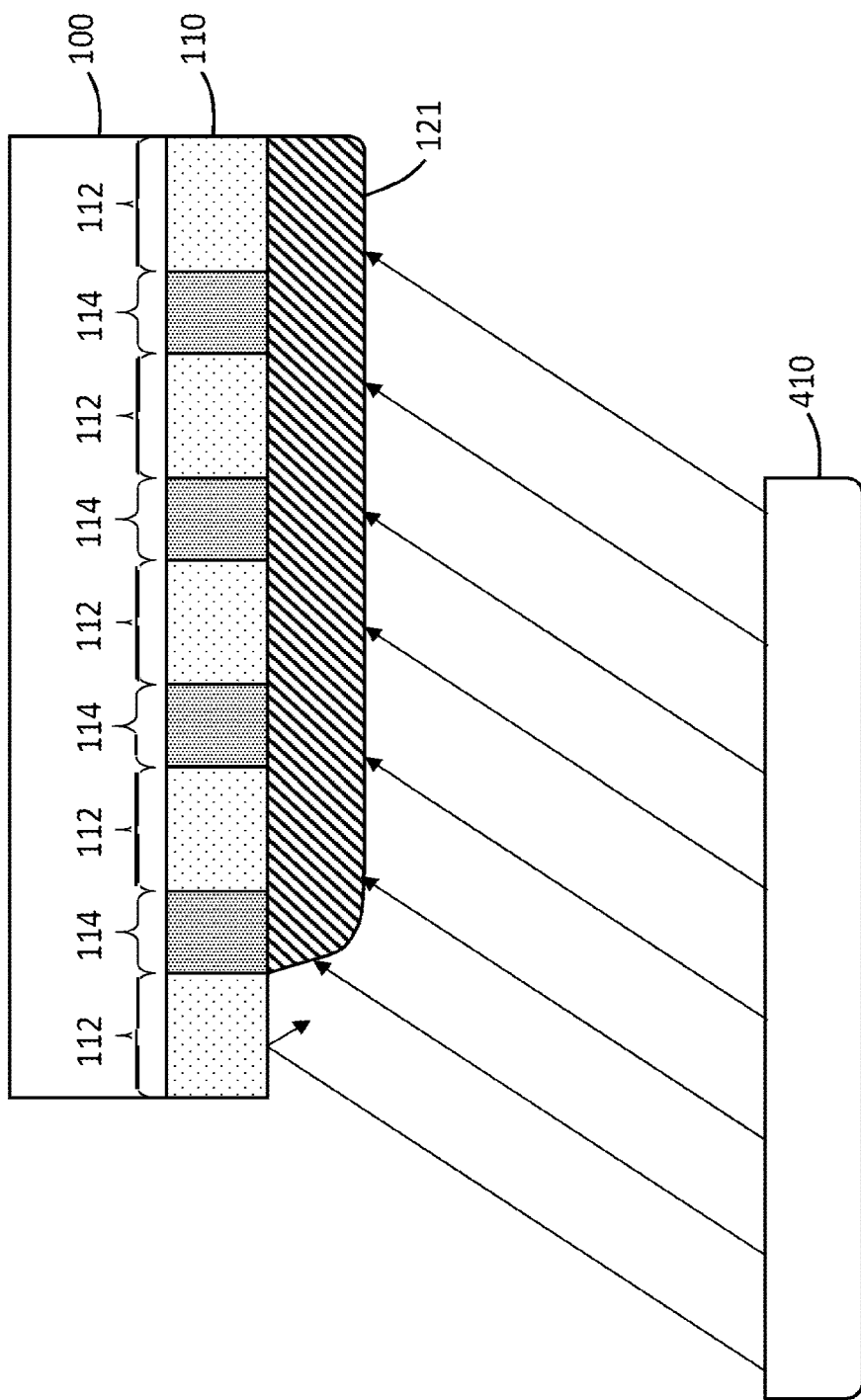
FIG. 6 is a schematic diagram illustrating the deposition of a conductive coating on the treated patterning coating of FIG. 3 according to another embodiment.
Figure 7:
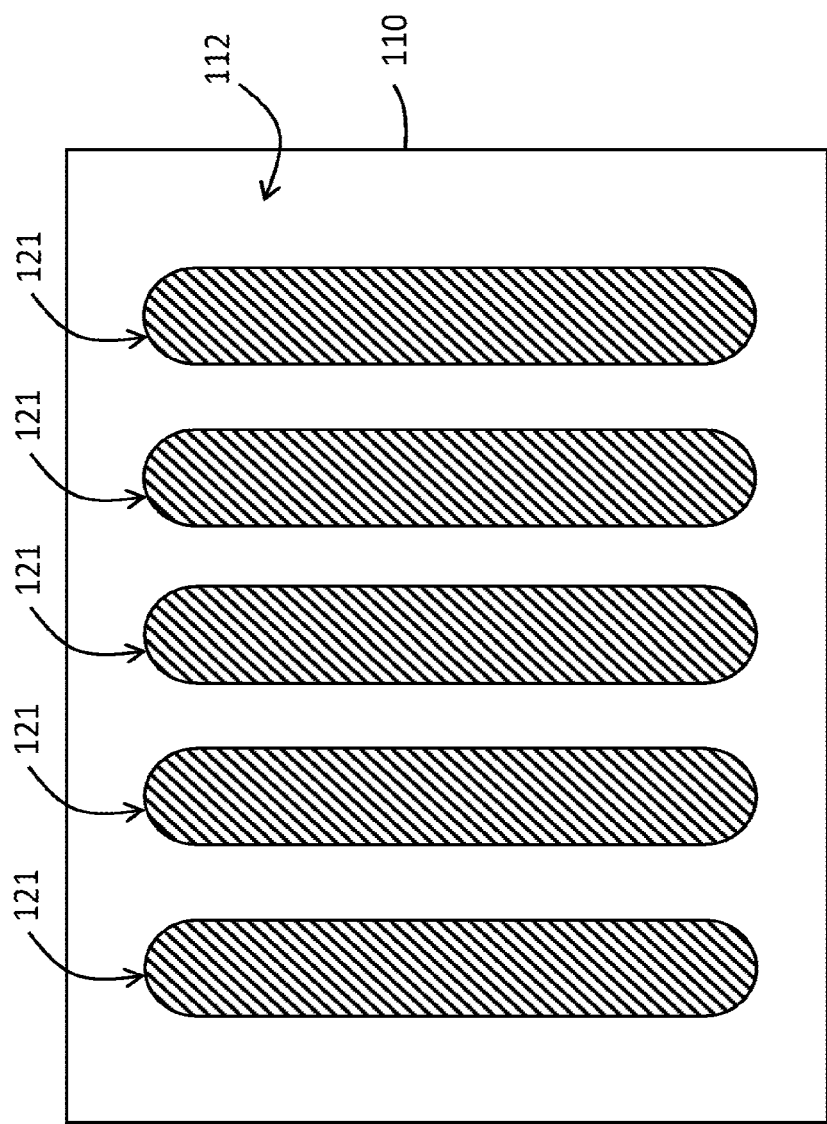
FIG. 7 is a diagram illustrating a top view of the treated patterning coating and the conductive coating according to the embodiment of FIG. 6.

FIG. 6 illustrates another embodiment wherein the deposition of the conductive coating 121 is conducted by subjecting the surface of the treated patterning coating 110 to a metal vapor flux that is incident on the surface of patterning coating 110 at a non-normal glancing angle. Since it is postulated that the angle at which the metal vapor flux is incident on the surface of the treated patterning coating 110 affects the growth mode, and more specifically the lateral growth mode of the conductive coating 121, the conductive coating 121 formed in this way may coat at least a portion of the first region 112. For example, the formation of the conductive coating 121 may be confined to areas corresponding to the second region 114 during the initial stages of the deposition. However, as the conductive coating 121 becomes thicker, the conductive coating 121 may grow laterally in the direction substantially parallel to the surface of the patterning coating 110, such that the conductive coating 121 covers or coats at least a portion of the first region 112. Depending on the relative size and configuration of the first region 112 and the second region 114 as well as the deposition parameter of the conductive coating 121, in at least some embodiments, the conductive coating 121 may exhibit sufficient lateral growth to bridge or cover the first region 112 disposed between neighboring areas of the second region 114. FIG. 7 illustrates an example of a top view of the conductive coating 121 formed by such process, wherein the conductive coating 121 is formed as strips over the patterning coating 110.

It will be appreciated that the patterning coating 110 may be treated to create various different shapes, sizes, and configurations of regions with varying degrees of affinity or initial sticking coefficient with respect to deposition of the conductive coating material. For example, the patterning coating 110 may be treated to create a grid-like pattern of a region exhibiting relatively high affinity or initial sticking coefficient.

Figure 8:
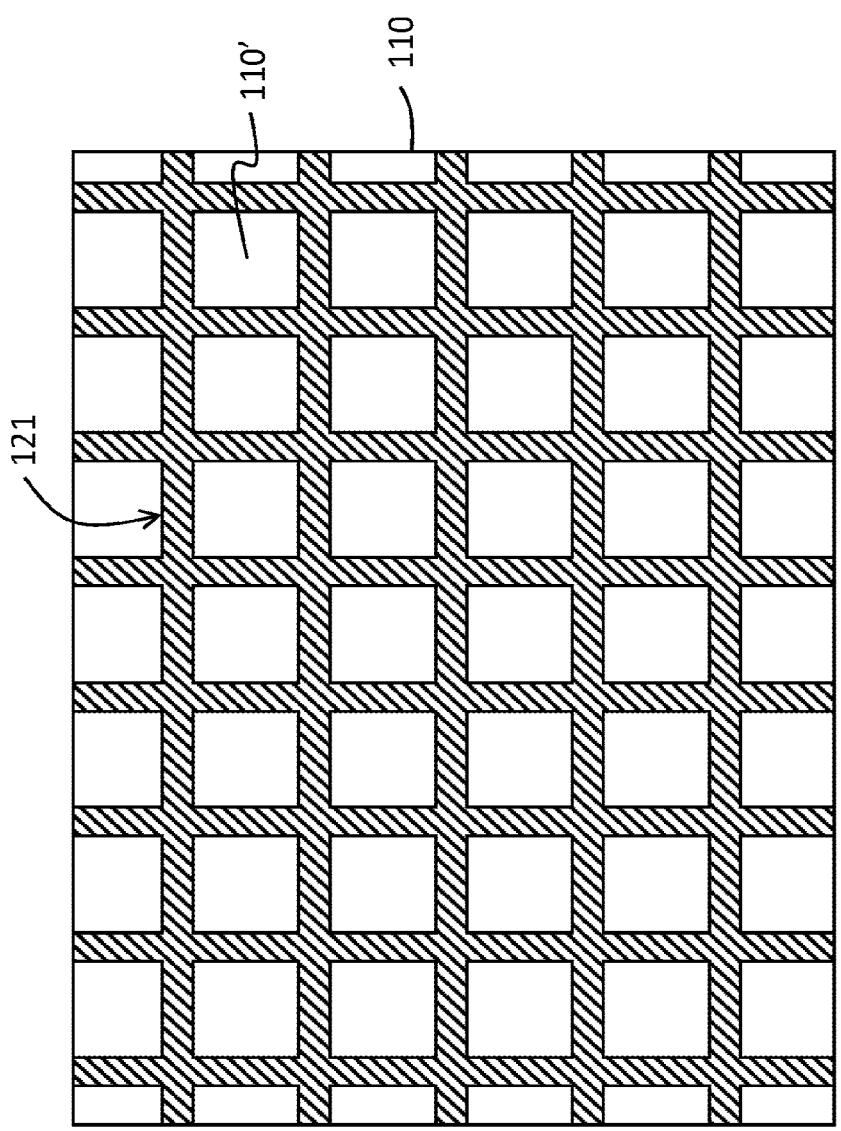
FIG. 8 is a diagram illustrating a top view of the treated patterning coating and the conductive coating according to one embodiment.

FIG. 8 illustrates one embodiment wherein the patterning coating 110 has been treated to create such grid-like pattern, and the surface of the patterning coating 110 is subjected to a metal vapor flux to selectively deposit the conductive coating 121 thereon. As illustrated, the patterning coating 110 encompasses regions 110' which are substantially free of the conductive coating material. In some embodiments, the patterning coating 110 and the conductive coating 121 illustrated in FIG. 8 may be disposed over an active-matrix OLED (AMOLED) device such that the conductive coating 121 acts as an auxiliary electrode. For example, the conductive coating 121 may be disposed over non-emissive regions of the AMOLED device and be in electrical contact with a common cathode, such that the conductive coating 121 acts as an auxiliary electrode to reduce the sheet resistance of the common cathode. In such example, the emissive regions of the AMOLED device (e.g., the pixels or subpixels) may be located in regions 110', such that the emissive regions remain substantially free of the conductive coating material. Further details of such embodiments are described, for example, in Applicant's co-pending application WO2017/072678, which is incorporated herein by reference in its entirety.

While various embodiments have been described above wherein a region of the patterning coating 110 is treated while other region(s) of the patterning coating 110 remains untreated, different regions of the patterning coating 110 may be subjected to different treatments or treatment conditions to form regions having different affinity or initial sticking coefficients. For example, a first region of the patterning coating 110 may be subjected to a first treatment to increase the affinity or initial sticking coefficient of the first region, while a second region of the patterning coating 110 may be subjected to a second treatment to decrease the affinity or initial sticking coefficient of the second region. In another example, a first region of the patterning coating 110 may be subjected to a first treatment to decrease the affinity or initial sticking coefficient of the first region, while a second region of the patterning coating 110 may be subjected to a second treatment to increase the affinity or initial sticking coefficient of the second region.

It will also be appreciated that the patterning coating 110 may be subjected to various multi-treatment stages, wherein the patterning coating 110 is subjected to two or more treatment stages prior to being subjected to a vapor flux of an evaporated conductive coating material. For example, the treated patterning coating 110 may be subjected to wet processes using solvents or plasma-based processes to remove portions of the treated patterning coating 110. In a further example, a treated region of the patterning coating 110 may be removed using such processes to uncover an underlying surface. In another example, an untreated region of the patterning coating 110 may be removed using such processes to uncover the underlying surface.

Coatings, including a patterning coating and a conductive coating, may be used to fabricate an electronic device in some embodiments. An example of such device is an opto-electronic device. An opto-electronic device generally encompasses any device that converts electrical signals into photons or vice versa. As such, an organic opto-electronic device can encompass any opto-electronic device where one or more active layers of the device are formed primarily of an organic material, and, more specifically, an organic semiconductor material. Examples of organic opto-electronic devices include, but are not limited to, OLED devices and organic photovoltaic (OPV) devices.

In some embodiments, an organic opto-electronic device is an OLED device, wherein an organic semiconducting layer includes an electroluminescent layer, which may also be referred to as an emissive layer. In some embodiments, the organic semiconducting layer may include additional layers, such as an electron injection layer, an electron transport layer, a hole transport layer, and/or a hole injection layer. For example, the hole injection layer may be formed using a hole injection material which generally facilitates the injection of holes by the anode. The hole transport layer may be formed using a hole transport material, which is generally a material that exhibits high hole mobility. The electroluminescent layer may be formed, for example, by doping a host material with an emitter material. The emitter material may be a fluorescent emitter, a phosphorescent emitter, or a TADF emitter, for example. A plurality of emitter materials may also be doped into the host material to form the electroluminescent layer. The electron transport layer may be formed using an electron transport material which generally exhibits high electron mobility. The electron injection layer may be formed using an electron injection material, which generally acts to facilitate the injection of electrons by the cathode.

For example, an OLED device may be an AMOLED device, a passive-matrix OLED (PMOLED) device, or an OLED lighting panel or module. Furthermore, the opto-electronic device may be a part of an electronic device. For example, the opto-electronic device may be an OLED display module of a computing device, such as a smartphone, a tablet, a laptop, or other electronic device such as a monitor or a television set.

It will also be appreciated that organic opto-electronic devices may be formed on various types of base substrates. For example, a base substrate may be a flexible or rigid substrate. The base substrate may include, for example, silicon, glass, metal, polymer (e.g., polyimide), sapphire, or other materials suitable for use as the base substrate.

In one aspect, a method for manufacturing an opto-electronic device is provided. The method includes providing a substrate. The substrate includes an emissive region and a non-emissive region. The emissive region further includes a first electrode and a second electrode, and a semiconducting layer disposed between the first electrode and the second electrode. The method includes depositing a patterning coating onto the substrate. The patterning coating is deposited to cover both the emissive region and the non-emissive region. The method includes treating the patterning coating disposed in the non-emissive region. By treating the patterning coating, the initial sticking probability of the patterning coating with respect to a conductive coating material is increased in the non-emissive region. The method includes depositing a conductive coating, where the conductive coating covers the non-emissive region. The conductive coating includes the conductive coating material.

Figure 9:
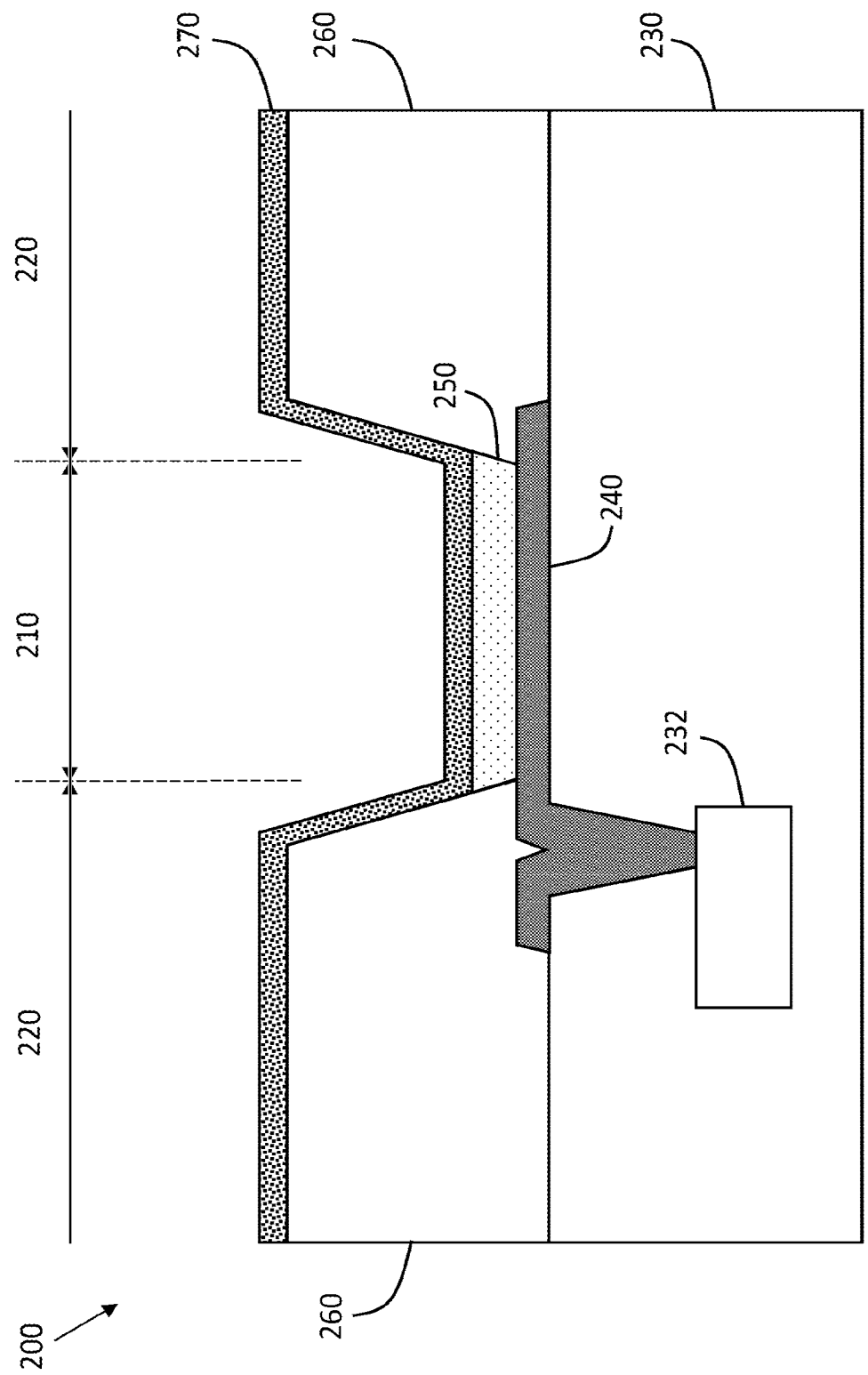
FIG. 9 is a schematic diagram illustrating a cross-sectional view of an active matrix OLED device at one stage of fabrication according to an embodiment.

FIGS. 9 to 12 illustrate various stages of a method for manufacturing an opto-electronic device 200 according to an embodiment. Referring to FIG. 9, the opto-electronic device 200 is illustrated as including a thin film transistor (TFT) substrate 230. The TFT substrate 230 includes one or more TFTs 232 formed therein. For example, such TFTs 232 may be formed by depositing and patterning a series of thin films when fabricating the TFT substrate 230. The TFT substrate 230 may include, for example, one or more top-gate TFTs, one or more bottom-gate TFTs, and/or other TFT structures. A TFT may be an n-type TFT or a p-type TFT. Examples of TFT structures include those including amorphous silicon (a-Si), indium gallium zinc oxide (IGZO), and low-temperature polycrystalline silicon (LTPS).

A first electrode 240 is provided on the TFT substrate 230 to be in electrical contact with the one or more TFTs 232. For example, the first electrode 240 may be an anode. A pixel definition layer (PDL) 260 is also provided on the surface of the TFT substrate 230, such that the PDL 260 covers the surface of the TFT substrate 230 as well as an edge or a perimeter of the first electrode 240. The PDL 260 defines an opening through which a surface of the first electrode 240 is exposed. The opening defined by the PDL 260 generally corresponds to an emissive region 210 of the device 200. For example, the device 200 may include a plurality of openings defined by the PDL 260, and each opening may correspond to a pixel or subpixel region of the device 200. The region of the device 200 in which the PDL 260 is provided generally corresponds to a non-emissive region 220. Accordingly, the emissive region 210 may be arranged adjacent to the non-emissive region 220 in the device 200. A semiconducting layer 250 is provided in at least the emissive region 210 of the device 200. The semiconducting layer 250 may also optionally be provided in the non-emissive region 220 of the device 200. For example, the semiconducting layer 250 may be formed as a common layer using an open mask or mask-free deposition process, such that the semiconducting layer 250 is disposed both in the emissive region 210 and the non-emissive region 220. As illustrated, the semiconducting layer 250 may be deposited over the exposed surface of the first electrode 240 in the region corresponding to the opening defined by the PDL 260. In some embodiments wherein the optoelectronic device 200 is an OLED device, the semiconducting layer 250 includes one or more organic semiconducting layers. For example, the semiconducting layer 250 may include an emissive layer. In some embodiments, the semiconducting layer 250 includes a hole injection layer, an electron blocking layer, a hole transport layer, an emissive layer, an electron transport layer, an electron injection layer, and any combinations of the foregoing. In some embodiments, the semiconducting layer 250 is deposited using a thermal evaporation process. In some embodiments, a shadow mask is used in conjunction with such thermal evaporation process to selectively deposit the semiconducting layer 250. The device 200 also includes a second electrode 270 disposed over the semiconducting layer 250. For example, the second electrode 270 may be a cathode. The second electrode 270 may include various materials used to form light transmissive conductive layers or coatings. For example, the second electrode 270 may include transparent conducting oxides (TCOs), metallic or non-metallic thin films, and any combination thereof. The second electrode 270 may further include two or more layers or coatings. For example, such layers or coatings may be distinct layers or coatings disposed on top of one another. The second electrode 270 may include various materials including, for example, indium tin oxide (ITO); zinc oxide (ZnO); other oxides containing indium, zinc (Zn), and/or gallium (Ga); magnesium (Mg); aluminum (Al); ytterbium (Yb); silver (Ag); Zn; cadmium (Cd); and any combinations thereof, including alloys containing any of the foregoing materials. For example, the second electrode 270 may include a Mg:Ag alloy, a Mg:Yb alloy, or a combination thereof. For a Mg:Ag alloy or a Mg:Yb alloy, the alloy composition may range from about 1:9 to about 9:1 by volume. In other examples, the second electrode 270 may include a Yb/Ag bilayer coating. For example, such bilayer coating may be formed by depositing a ytterbium coating, followed by a silver coating. The thickness of the silver coating may be greater than the thickness of the ytterbium coating or vice versa. In yet another example, the second electrode 270 is a multi-layer cathode including one or more metallic layers and one or more oxide layers. In yet another example, the second electrode 270 may include a fullerene and magnesium. For example, such coating may be formed by depositing a fullerene coating followed by a magnesium coating. In another example, a fullerene may be dispersed within a magnesium coating to form a fullerene-containing magnesium alloy coating. Examples of such coatings are further described in US Patent Application Publication No. US 2015/0287846 (published Oct. 8, 2015) and in PCT Publication No. WO2018/033860 (PCT Application No. PCT/IB2017/054970 filed Aug. 15, 2017), which are incorporated herein by reference in their entireties. In some embodiments, the deposition of the second electrode 270 is performed using an open mask or without a mask. For example, the second electrode 270 may be formed as a common electrode by subjecting the exposed top surfaces of the PDL 260 and the semiconducting layer 250 to an evaporated flux of a material for forming the second electrode 270. Accordingly, at least in some embodiments, the second electrode 270 may be provided in both the emissive region 210 and the non-emissive region 220.

Figure 10:
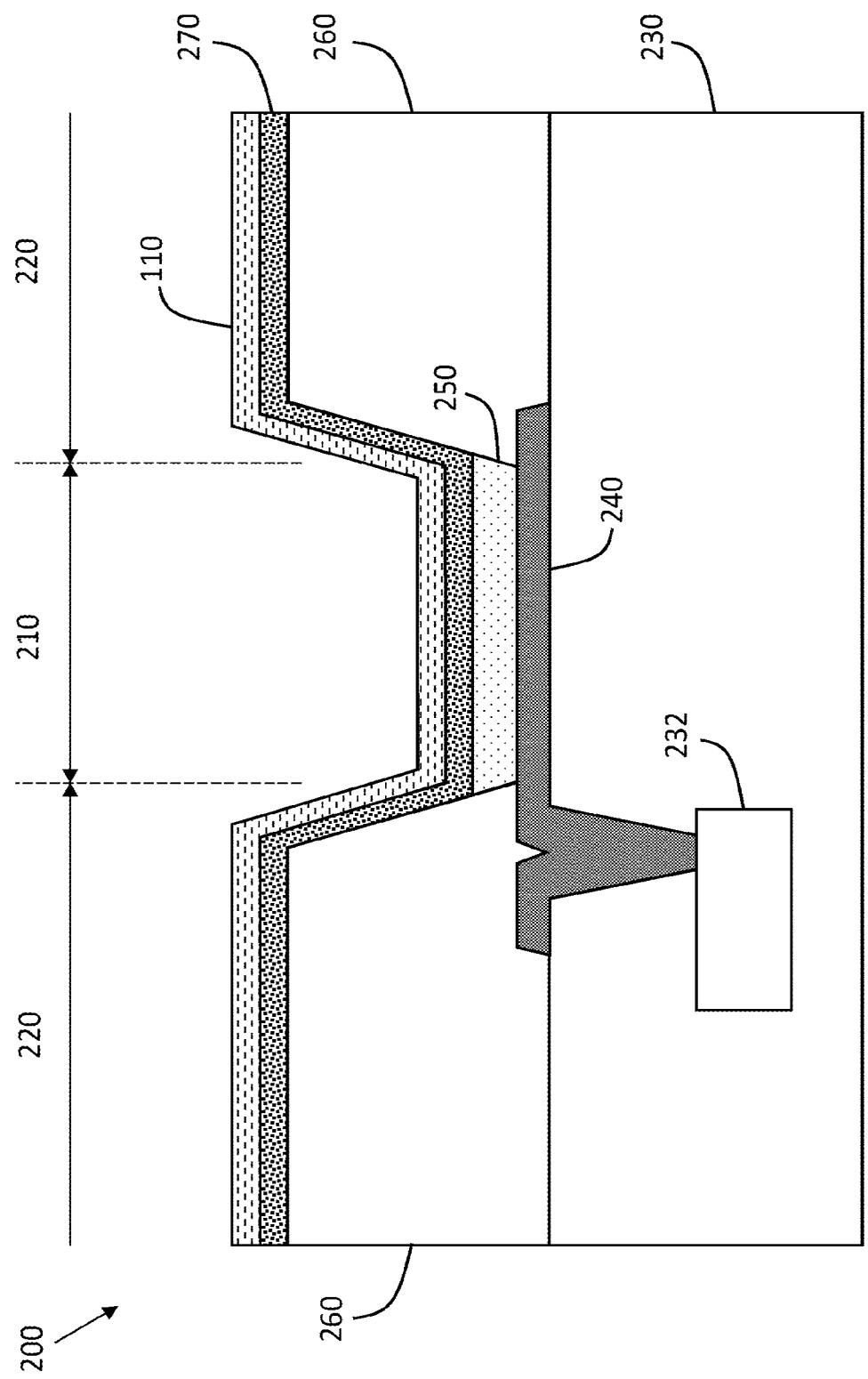
FIG. 10 is a schematic diagram illustrating a cross-sectional view of the active matrix OLED device at another stage of fabrication according to the embodiment of FIG. 9.

FIG. 10 illustrates a patterning coating 110 being disposed over the second electrode 270. In some embodiments, the deposition of the patterning coating 110 is performed using an open mask or without a mask. For example, the patterning coating 110 may be deposited by subjecting the exposed top surface of the second electrode 270 to an evaporated flux of a material for forming the patterning coating 110. In other embodiments, the patterning coating 110 may be formed by other surface coating methods and techniques including spin coating, dip coating, printing (including ink jet printing), spray coating, OVPD, LITI patterning, PVD, including sputtering, chemical vapor deposition (CVD), and combinations thereof. In the illustrated embodiment, the patterning coating 110, when untreated, generally acts as a nucleation inhibiting coating. In other words, the patterning coating 110 exhibits a relatively low affinity or initial sticking probability towards deposition of a conductive coating material when untreated. As illustrated in FIG. 10, the patterning coating 110 is deposited over, and in direct contact with, the second electrode 270 in some embodiments.

Figure 11:
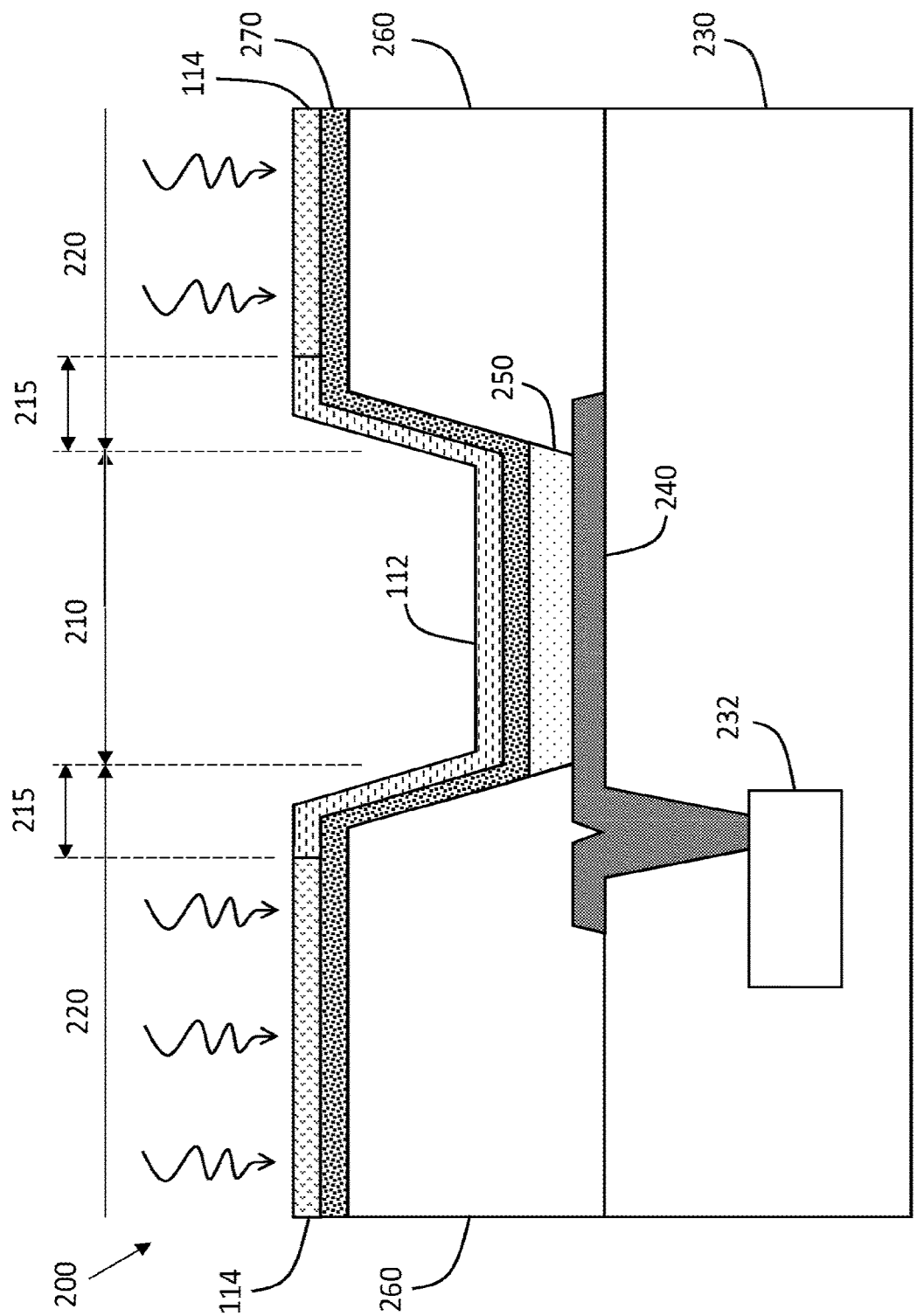
FIG. 11 is a schematic diagram illustrating a cross-sectional view of the active matrix OLED device at yet another stage of fabrication according to the embodiment of FIG. 9.

FIG. 11 illustrates a portion of the patterning coating 110 being treated. Specifically, the portion of the patterning coating 110 disposed in the non-emissive region 220 is treated to increase the initial sticking probability or affinity towards deposition of the conductive coating material thereon. Upon selectively treating the patterning coating 110, a first region 112 and a second region 114 of the patterning coating 110 are formed. In the illustrated embodiment, the first region 112 corresponds to a portion of the patterning coating 110 which has not been treated (e.g., untreated portion), and the second region 114 corresponds to a portion of the patterning coating 110 which has been treated (e.g., treated portion). In the illustrated embodiment, the first region 112 is disposed in the emissive region 210 of the device 200 and the second region 114 is disposed in the non-emissive region 220 of the device 200. As would be appreciated, the second region 114 generally exhibits a higher initial sticking probability or affinity than the first region 112. Various processes and techniques for treating the patterning coating 110 have been described in the foregoing, and any such processes and techniques may be used to treat the patterning coating 110 in the illustrated embodiment. In some embodiments, the patterning coating 110 may be treated by exposing a portion of the patterning coating 110 arranged in the non-emissive region 220 to an electromagnetic radiation. For example, such treatment may be performed using a mask, such as a photomask, or a laser. In some embodiments, a buffer region 215 may be provided in the non-emissive region 220. For example, the patterning coating 110 in the buffer region 215 may be left untreated or partially treated. The buffer region 215 may generally be arranged adjacent to, or immediately adjacent to, the emissive region 210. In some applications, it may be advantageous to provide the buffer region 215 to reduce the likelihood of the treatment for the patterning coating 110 affecting other layers, coatings, and/or structures of the device 200. Without wishing to be bound by any particular theory, it is postulated that portions of the device 200, such as for example the semiconducting layer 250 and the TFT 232, may be susceptible to exposure to certain electromagnetic radiations which may cause materials forming such layers and structures to degrade and/or the performance of the device 200 to be altered as a result of such exposure. By providing the buffer region 215, the likelihood of undesirable changes occurring to the device 200 is reduced. In some embodiments, the device 200 may include a shielding element for reducing the penetration of electromagnetic radiation to the TFT substrate 230. For example, such shielding element may be provided in the non-emissive region 220 of the device 200. In some embodiments, the PDL 260 may act as, or form a portion of, such shielding element.

Figure 12:
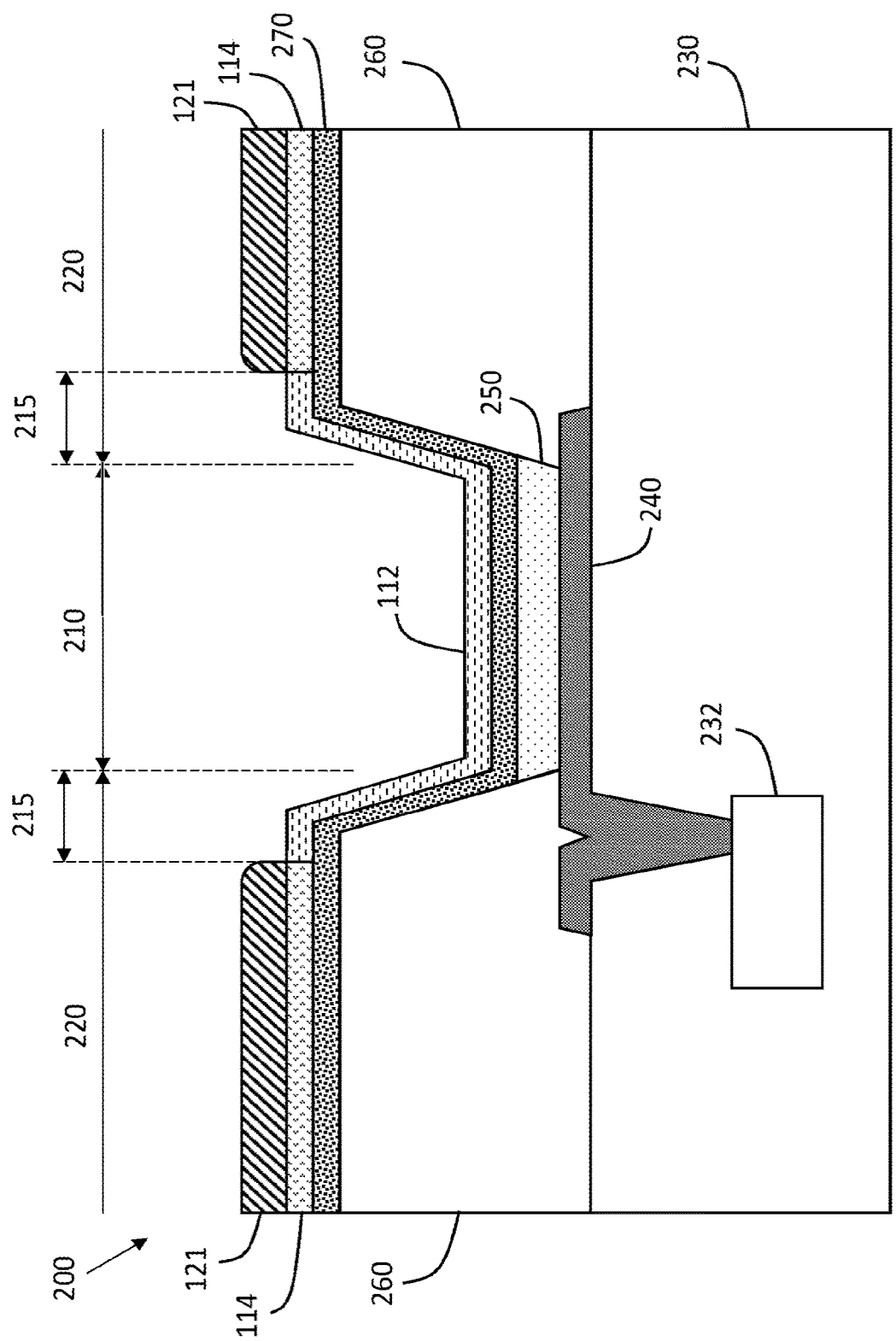
FIG. 12 is a schematic diagram illustrating a cross-sectional view of the active matrix OLED device at yet another stage of fabrication according to the embodiment of FIG. 9.

FIG. 12 illustrates the deposition of a conductive coating 121. The conductive coating 121 is deposited over the second region 114 of the patterning coating 110 in the non-emissive region 220 of the device 200. In some embodiments, the deposition of the conductive coating 121 is conducted by directing an evaporated flux of a material for forming the conductive coating 121 towards the surfaces of the first region 112 and the second region 114 of the patterning coating 110. For example, an evaporator source may be used to generate the evaporated flux of the conductive coating material, and direct the evaporated flux such that it is incident on both treated region (e.g., second region 114) and untreated region (e.g., first region 112) of the device 200. However, since a surface of the untreated patterning coating 110 in the first region 112 exhibits a relatively low initial sticking coefficient compared to that of the treated patterning coating 110 in the second region 114, the conductive coating 121 selectively deposits onto areas of the device 200 where the untreated patterning coating 110 is not present. In this way, the conductive coating 121 may be selectively deposited on the portion of the device 200 corresponding to the second region 114 of the patterning coating 110, while keeping the first region 112 substantially free of, or uncovered by, the conductive coating 121. In some embodiments, the conductive coating 121 is deposited on top of, and in direct contact with, the second region 114 of the patterning coating 110. While the conductive coating 121 is illustrated as being deposited to selectively cover the second region 114 of the patterning coating 110, in other embodiments, the conductive coating 121 may additionally cover or overlap a portion of the first region 112, such as for example a region corresponding to a portion of the buffer region 215. In another embodiment, a portion of the second region 114 may be exposed from or uncovered by the conductive coating 121. While a cross-sectional profile of the conductive coating 121 at an edge is illustrated as extending substantially vertically in the embodiment of FIG. 12, it will be appreciated that such profile may differ in other embodiments. For example, the edge profile may include curved, linear, vertical, horizontal, and/or angled segments or portions.

The conductive coating 121 may act as an auxiliary electrode or a busbar for the device 200. Accordingly, the conductive coating 121 may be in electrical contact with the second electrode 270. In such embodiments, the sheet resistance of the conductive coating 121 may be less than the sheet resistance of the second electrode 270, and thus by electrically contacting the conductive coating 121 with the second electrode 270, the effective sheet resistance of the second electrode 270 may be reduced. For example, a thickness of the conductive coating 121 may be greater than a thickness of the second electrode 270 to attain a lower sheet resistance, for example, at least about 1.1 times greater, at least about 1.3 times greater, at least about 1.5 times greater, or at least about 2 times greater.

Particularly in a top-emission AMOLED device, it is desirable to deposit a relatively thin layer of the second electrode 270 to reduce optical interference (e.g., attenuation, reflection, diffusion, and so forth) due to the presence of the second electrode 270 in the optical path of the light emitted by such device. However, a reduced thickness of the second electrode 270 generally increases a sheet resistance of the second electrode 270, thus reducing the performance and efficiency of the OLED device 200. By providing the conductive coating 121 that is electrically connected to the second electrode 270, the sheet resistance and thus the IR drop associated with the second electrode 270 can be decreased. Furthermore, by selectively depositing the conductive coating 121 to cover certain regions of the device area while other regions remain uncovered, optical interference due to the presence of the conductive coating 121 may be controlled and/or reduced. In the illustrated embodiment, for example, the emissive region 210 is substantially free of, or is uncovered by, the conductive coating 121 such that the light emission from the device 200 is not attenuated or negatively affected by the presence of the conductive coating 121. While the second region 114 of the patterning coating 100 is illustrated as being arranged at the interface between the conductive coating 121 and the second electrode 270, it will be appreciated that the presence of the patterning coating 110 may not prevent or substantially inhibit the conductive coating 121 from becoming electrically connected to the second electrode 270. For example, the presence of a relatively thin film of the patterning coating 110 between the conductive coating 121 and the second electrode 270 may still sufficiently allow a current to pass therethrough, thus allowing a sheet resistance of the second electrode 270 to be reduced.

In some embodiments, the patterning coating 110 may be formed as a relatively thin coating to allow the second electrode 270 and the conductive coating 121 to be electrically connected to each other without significant electrical resistance. For example, the patterning coating 110 may have a thickness of about 100 nm or less, about 80 nm or less, about 50 nm or less, about 40 nm or less, about 30 nm or less, about 25 nm or less, about 20 nm or less, about 15 nm or less, about 10 nm or less, or about 5 nm or less. For example, the patterning coating 110 may have a thickness from about 1 nm to about 30 nm, from about 1 nm to about 25 nm, from about 1 nm to about 20 nm, from about 1 nm to about 15 nm, from about 1 nm to about 10 nm, from about 5 nm to about 15 nm, or from about 5 nm to about 10 nm.

In some embodiments, the patterning coating 110 is light transmissive or substantially transparent. In some embodiments, the patterning coating 110 does not exhibit significant absorption in the visible portion of the electromagnetic spectrum. For example, the visible portion of the electromagnetic spectrum may generally correspond to wavelengths from about 390 nm to about 700 nm. In some embodiments, the patterning coating 110 may have an optical absorption of about 25 percent or less, about 20 percent or less, about 15 percent or less, about 10 percent or less, about 5 percent or less, about 3 percent or less, or about 2 percent or less in the visible portion of the electromagnetic spectrum. For example, the optical absorption may be calculated as an average optical absorption taken across the wavelength range of between about 390 nm and about 700 nm. Alternatively, the optical absorption may be determined by measuring the absorption at certain wavelengths falling within the visible portion of the electromagnetic spectrum. For example, the optical absorption may be measured at a wavelength of about 400 nm, about 450 nm, about 500 nm, about 550 nm, about 600 nm, about 650 nm, or about 700 nm. It may be particularly desirable for the patterning coating 110 to be light transmissive or substantially transparent in embodiments wherein the pattering coating 110 is disposed over the emissive region 210 of the device 200. In such embodiments, the patterning coating 110 exhibiting low optical absorption may not significantly interfere or absorb the light emitted by the device 200, and therefore may be particularly desirable. In some embodiments wherein the patterning coating 110 is disposed over the emissive region 210 of the device 200 that is an AMOLED device, it may be desirable to form the patterning coating 110 such that it does not exhibit significant absorption in the wavelength range corresponding to the emission wavelength of such device 200. For example, the patterning coating 110 may have an optical absorption of about 25 percent or less, about 20 percent or less, about 15 percent or less, about 10 percent or less, about 5 percent or less, about 3 percent or less, or about 2 percent or less in the wavelength range corresponding to the emission wavelength of the device 200. For example, such wavelength range may correspond to wavelengths from about 420 nm to about 700 nm, or from about 440 nm to about 650 nm. In other examples, such wavelength range may correspond to the emission wavelengths associated with each color such as, for example, from about 440 nm to about 475 nm for blue emission, from about 520 nm to about 555 nm for green emission, and from about 610 nm to about 650 nm for red emission.

In some embodiments, the patterning coating 110 is light transmissive or substantially transparent at least in its untreated form. Accordingly, referring to the embodiment of FIG. 12, the first region 112 of the patterning coating 110 may be light transmissive or substantially transparent. In some embodiments, the patterning coating 110 is formed to be light transmissive or substantially transparent by forming the patterning coating 110 using a patterning coating material exhibiting a relatively low optical absorption. In some embodiments, the patterning coating 110 is formed as a relatively thin coating. In this way, the light transmittance through the patterning coating 110 may be enhanced while allowing the second electrode 270 and the conductive coating 121 to be electrically connected to one another without significant electrical resistance due to the presence of the patterning coating 110.

In some embodiments, the patterning coating 110 includes, or is formed by, a patterning coating material exhibiting absorption in a portion of the visible wavelengths of the electromagnetic spectrum. For example, such patterning coating material may absorb light having a wavelength less than about 550 nm, less than about 500 nm, less than about 450 nm, less than about 430 nm, or less than about 410 nm. For example, the patterning coating 110 formed using such patterning coating material may allow the patterning coating 110 to be treated by exposure to light having a longer wavelength of, for example, greater than about 360 nm, greater than about 380 nm, greater than about 390 nm, greater than about 400 nm, or greater than about 420 nm, or, for example, from about 360 nm to about 550 nm, from about 360 nm to about 500 nm, from about 360 nm to about 460 nm, or from about 380 nm to about 450 nm to modify the affinity or initial sticking probability of a portion of the patterning coating 110. In some cases, it may be advantageous to treat the patterning coating 110 using light having a longer wavelength to reduce the likelihood of such light damaging the device 200 or portions thereof, such as the TFT 232, for example. The absorption of light emitted by the emissive region 210 of the device 200 due to the presence of the patterning coating 110 may be reduced by forming the patterning coating 110 as a relatively thin coating having, for example, a thickness from about 1 nm to about 30 nm, from about 3 nm to about 25 nm, from about 5 nm to about 20 nm, from about 5 nm to about 15 nm, or from about 5 nm to about 10 nm.

In some embodiments, the device 200 further includes additional coatings and/or elements such as, for example, an outcoupling layer, a color filter, optical compensation films, a circular polarizer, a quarter wave plate, an encapsulation coating including thin film encapsulation (TFE) layers, a barrier film, an adhesive including a optically clear adhesive (OCA), and a touch sensing element.

Figure 13:
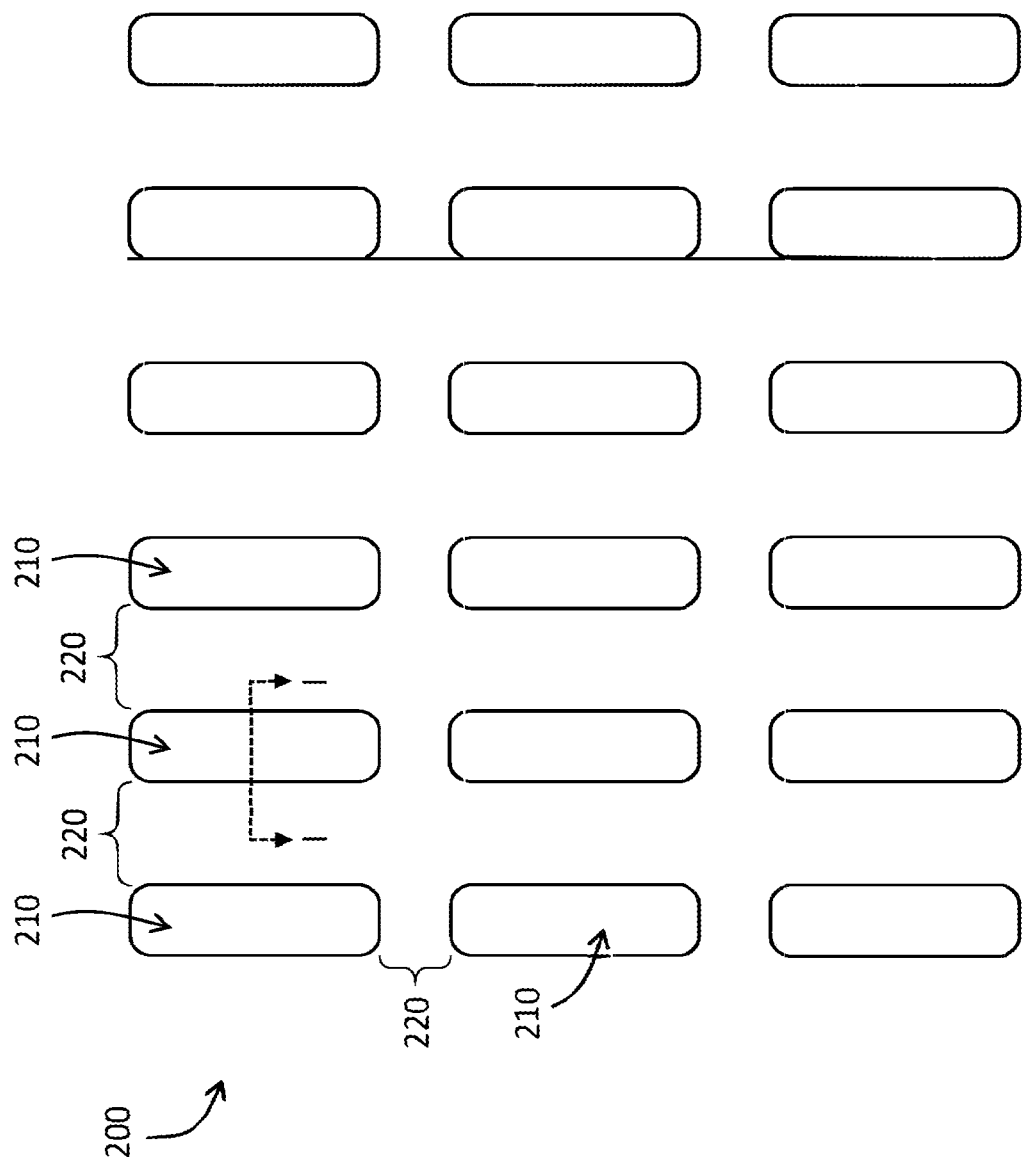
FIG. 13 is a schematic diagram illustrating a top view of a portion of an active matrix OLED device according to one embodiment.

FIG. 13 illustrates a top view of the device 200 according to one embodiment wherein the device 200 includes a plurality of emissive regions 210. For example, the device 200 may be an AMOLED device and each of the emissive regions 210 may correspond to a pixel or subpixel of such device. For example, the emissive regions 210 may be configured to emit light of different colors such as red, green, blue, and white. The neighboring emissive regions 210 are separated by a non-emissive region 220. In some embodiments, a cross-section of the device 200 taken along line I-I in FIG. 13 may correspond to the cross-section illustrated in the embodiment of FIG. 12.

Figure 14:
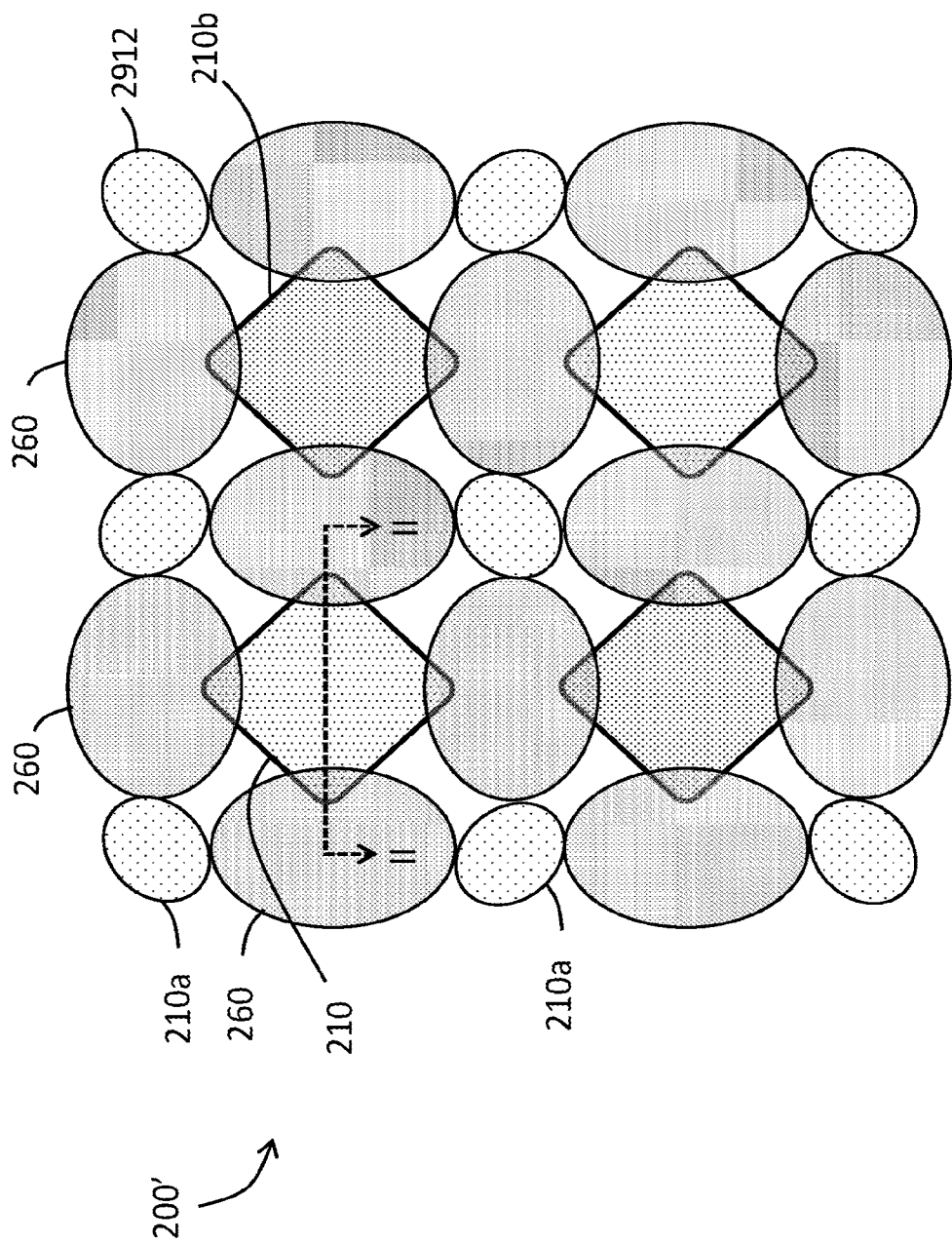
FIG. 14 is a schematic diagram illustrating a top view of a portion of an active matrix OLED device according to another embodiment.

FIG. 14 is a schematic illustration of an AMOLED device 200' having a diamond pixel arrangement according to one embodiment. The device 200' includes a plurality of PDLs 260 and emissive regions 2912 (sub-pixels) disposed between neighboring PDLs 260. The emissive regions 2912 include those corresponding to first sub-pixels 210, which may, for example, correspond to blue sub-pixels, second sub-pixels 210a, which may, for example, correspond to green sub-pixels, and third sub-pixels 210b, which may, for example, correspond to red sub-pixels. As would be appreciated, the regions between the emissive regions 2912 or subpixels 210, 210a, and 210b constitute the non-emissive regions. In some embodiments, a cross-section of the device 200' taken along line II-II in FIG. 14 may correspond to the cross-section illustrated in the embodiment of FIG. 12.

It will be appreciated that AMOLED device 200, 200' may include any number of emissive regions or subpixels. For example, the device 200, 200' may include a plurality of pixels, wherein each pixel includes 2, 3, or more subpixels. Furthermore, the specific arrangement of the pixels or subpixels with respect to other pixels or subpixels may be varied depending on the device design. For example, the subpixels may be arranged according to suitable arrangement schemes such as RGB side-by-side, diamond, or PenTile®.

At least some of the above embodiments have been described in reference to various layers or coatings, including a patterning coating and a conductive coating being formed using an evaporation process. As will be understood, an evaporation process is a type of PVD process where one or more source materials are evaporated or sublimed under a low pressure (e.g., vacuum) environment and deposited on a target surface through de-sublimation of the one or more evaporated source materials. A variety of different evaporation sources may be used for heating a source material, and, as such, it will be appreciated that the source material may be heated in various ways. For example, the source material may be heated by an electric filament, electron beam, inductive heating, or by resistive heating.

In some embodiments, a conductive coating may include magnesium. For example, the conductive coating may be pure or substantially pure magnesium. In other embodiments, the conductive coating may include high vapor pressure materials, such as ytterbium (Yb), cadmium (Cd), zinc (Zn), or any combination thereof.

In one embodiment, a conductive coating may be substantially non-transmissive or opaque in the visible wavelength range of the electromagnetic spectrum. For example, a relatively thick conductive coating having an average thickness of about 60 nm or greater, about 80 nm or greater, about 100 nm or greater, about 150 nm or greater, about 200 nm or greater, about 400 nm or greater, about 500 nm or greater, about 600 nm or greater, about 800 nm or greater, or about 1 μm or greater may be substantially non-transmissive or opaque, since the presence of a thick coating would generally result in significant absorption of light. In some embodiments wherein the conductive coating acts as an auxiliary electrode for an AMOLED device, the thickness of the conductive coating may, for example, be from about 60 nm to about 5 μm, from about 80 nm to about 3 μm, from about 100 nm to about 1 μm, from about 150 nm to about 1 μm, from about 200 nm to about 800 nm, or from about 250 nm to about 500 nm.

In another embodiment, a conductive coating may be substantially transparent or transmissive in the visible wavelength range of the electromagnetic spectrum. For example, a relatively thin conductive coating having an average thickness of about 60 nm or less, about 50 nm or less, about 40 nm or less, about 30 nm or less, about 20 nm or less, or about 10 nm or less may be substantially transparent or light transmissive. In another example, a conductive coating may be semi-transparent. For example, a conductive coating having an average thickness from about 30 nm to about 200 nm, about 40 nm to about 150 nm, about 50 nm to about 100 nm, or about 50 nm to about 80 nm may allow partial transmission of light therethrough, thus resulting in a semi-transparent coating.

In some embodiments, a conductive coating may be electrically conductive. In some embodiments, the conductive coating includes, or is formed by, a metallic material.

A deposition source material used to deposit a conductive coating may be a mixture or a compound, and, in some embodiments, at least one component of the mixture or compound is not deposited on a substrate during deposition (or is deposited in a relatively small amount compared to, for example, magnesium). In some embodiments, the source material may be a copper-magnesium (Cu—Mg) mixture or a Cu—Mg compound. In some embodiments, the source material for a magnesium deposition source includes magnesium and a material with a lower vapor pressure than magnesium, such as, for example, Cu. In other embodiments, the source material for a magnesium deposition source is substantially pure magnesium. Specifically, substantially pure magnesium can exhibit substantially similar properties (e.g., initial sticking probabilities on coatings) compared to pure magnesium (99.99% and higher purity magnesium). Purity of magnesium may be about 95% or higher, about 98% or higher, about 99% or higher, about 99.9% or higher, about 99.99% or higher, or about 99.999% or higher. Deposition source materials used to deposit a conductive coating may include other metals in place of, or in combination with, magnesium. For example, a source material may include high vapor pressure materials, such as ytterbium (Yb), cadmium (Cd), zinc (Zn), or any combination thereof.

Furthermore, it will be appreciated that processes of various embodiments may be performed on surfaces of various organic or inorganic materials used as an electron injection layer, an electron transport layer, an electroluminescent layer, and/or a PDL of an organic opto-electronic device. Examples of such materials include organic molecules as well as organic polymers such as those described in PCT Publication No. WO 2012/016074. It will also be understood by persons skilled in the art that organic materials doped with various elements and/or inorganic compounds may still be considered to be an organic material. It will further be appreciated by those skilled in the art that various organic materials may be used, and the processes described herein are generally applicable to an entire range of such organic materials.

It will also be appreciated that an inorganic substrate or surface can refer to a substrate or surface primarily including an inorganic material. For greater clarity, an inorganic material will generally be understood to be any material that is not considered to be an organic material. Examples of inorganic materials include metals, glasses, and minerals. Other examples of surfaces on which the processes according to the present disclosure may be applied include those of silicon or silicone-based polymers, inorganic semiconductor materials, electron injection materials, salts, metals, and metal oxides.

It will be appreciated that a substrate may include a semiconductor material, and, accordingly, a surface of such a substrate may be a semiconductor surface. A semiconductor material may be described as a material which generally exhibits a band gap. For example, such a band gap may be formed between a highest occupied molecular orbital (HOMO) and a lowest unoccupied molecular orbital (LUMO). Semiconductor materials thus generally possess electrical conductivity that is less than that of a conductive material (e.g., a metal) but greater than that of an insulating material (e.g., a glass). It will be understood that a semiconductor material may be an organic semiconductor material or an inorganic semiconductor material.

In some embodiments, a material for forming the patterning coating 110 is physically and/or chemically modified upon being treated. In some embodiments, a surface of the patterning coating 110 is physically and/or chemically modified upon being treated. For example, the patterning coating 110 may be treated by exposing the second region 114 to an electromagnetic radiation while keeping the first region 112 of the patterning coating 110 unexposed to such radiation. For example, the second region 114 may be exposed to UV radiation in an oxygen-rich environment, such as in air. In this way, the surface of the patterning coating 110 disposed in the second region 114 may be chemically reacted to functionalize the surface with oxygen species. For example, oxygen species such as elemental oxygen (O) and/or hydroxyl group (OH) may be chemically bonded to the surface of the patterning coating 110 in the treated second region 114, thereby increasing the affinity or initial sticking probability of such surface to evaporated flux of a conductive coating material. In such embodiments, the concentration of an oxygen species on a surface in the second region 114 is greater than a concentration of the oxygen species on a surface in the first region 112, such as, for example, at least about 1.1 times greater, at least about 1.3 times greater, at least about 1.5 times greater, or at least about 2 times greater. Without wishing to be bound by any particular theory, it is postulated that, at least in some cases, subjecting the patterning coating 110 to such treatment may physically and/or chemically modify the surface while the remainder of the treated patterning coating 110 may be substantially unchanged. It is also postulated that, for example, such treatment may modify the composition of the patterning coating 110 in a portion of the patterning coating 110 disposed within about 5 nm of the surface of the coating 110, within about 3 nm of the surface of the coating 110, within about 2 nm of the surface of the coating 110, or within about 1 nm of the surface of the coating 110, while the remainder of the coating 110 is substantially unchanged or unmodified.

In some embodiments, the patterning coating 110 is formed integrally or continuously. Accordingly, in some embodiments, the patterning coating 110 has a relatively uniform thickness. For example, even after treating the patterning coating 110 to form the first region 112 and the second region 114, the thickness of the patterning coating 110 in the first region 112 and the thickness of the patterning coating 110 in the second region 114 may substantially be identical to one another, such as where the former is within ±10% of the latter, or within ±5%, within ±4%, within ±3%, within ±2%, or within ±1%. In some embodiments, the thickness of the patterning coating 110 is unchanged upon treating the patterning coating 100.

Figure 15:
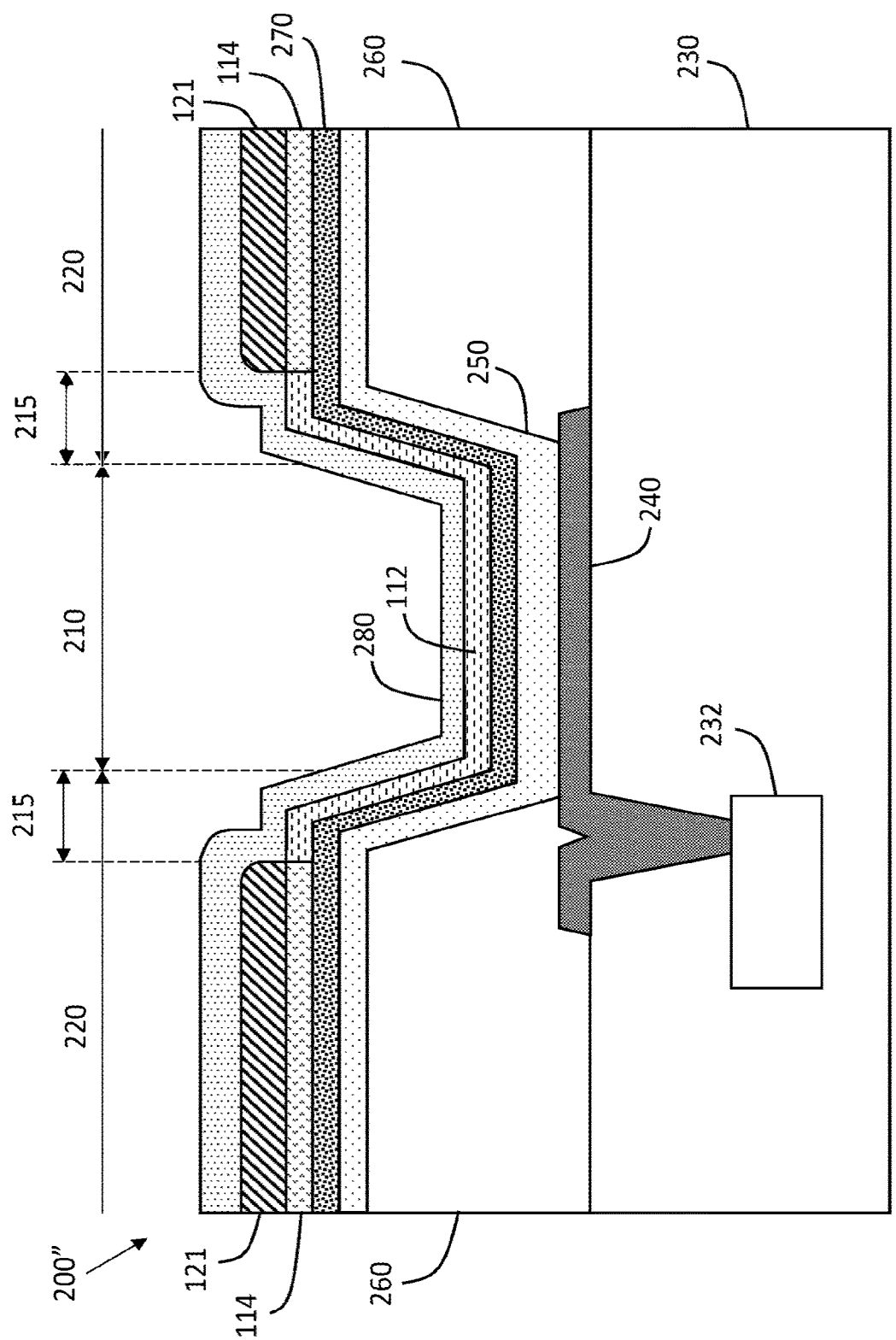
FIG. 15 is schematic diagram illustrating a cross-sectional view of an active matrix OLED device according to an embodiment.

FIG. 15 illustrates a cross-sectional view of an AMOLED device 200″ according to one embodiment wherein the semiconducting layer 250 is deposited outside of the emissive region 210 and an outcoupling layer 280 is provided over the first region 112 of the patterning coating 110 and the conductive coating 121. Specifically in the embodiment of FIG. 15, the semiconducting layer 250 is deposited both in the emissive region 210 and the non-emissive region 220 of the device 200″. For example, the semiconducting layer 250 may be deposited using a shadow mask having an aperture which is larger than the emissive region 210 of the device 200″. In this way, the semiconducting layer 250 may cover a portion of the PDL 260 in the non-emissive region 220. In another example, the semiconducting layer 250 may be deposited using an open mask or without a mask as a common layer. For example, the device 200″ may be configured to emit substantially white light, and a color filter (not shown) may be provided to selectively transmit the corresponding color of the pixel or subpixel from each emissive region 210. In the embodiment of FIG. 15, the outcoupling layer 280 is illustrated as being provided in the emissive region 210 and the non-emissive region 220 of the device 200″. For example, the outcoupling layer 280 may be formed as a common layer. In the illustrated embodiment, the outcoupling layer 280 covers, and is in direct contact with, the first region 112 of the patterning coating 110 and the conductive coating 121. Specifically in such device configuration, the conductive coating 121 is arranged between the second region 114 of the patterning coating 110 and the outcoupling layer 280.

Figure 16:
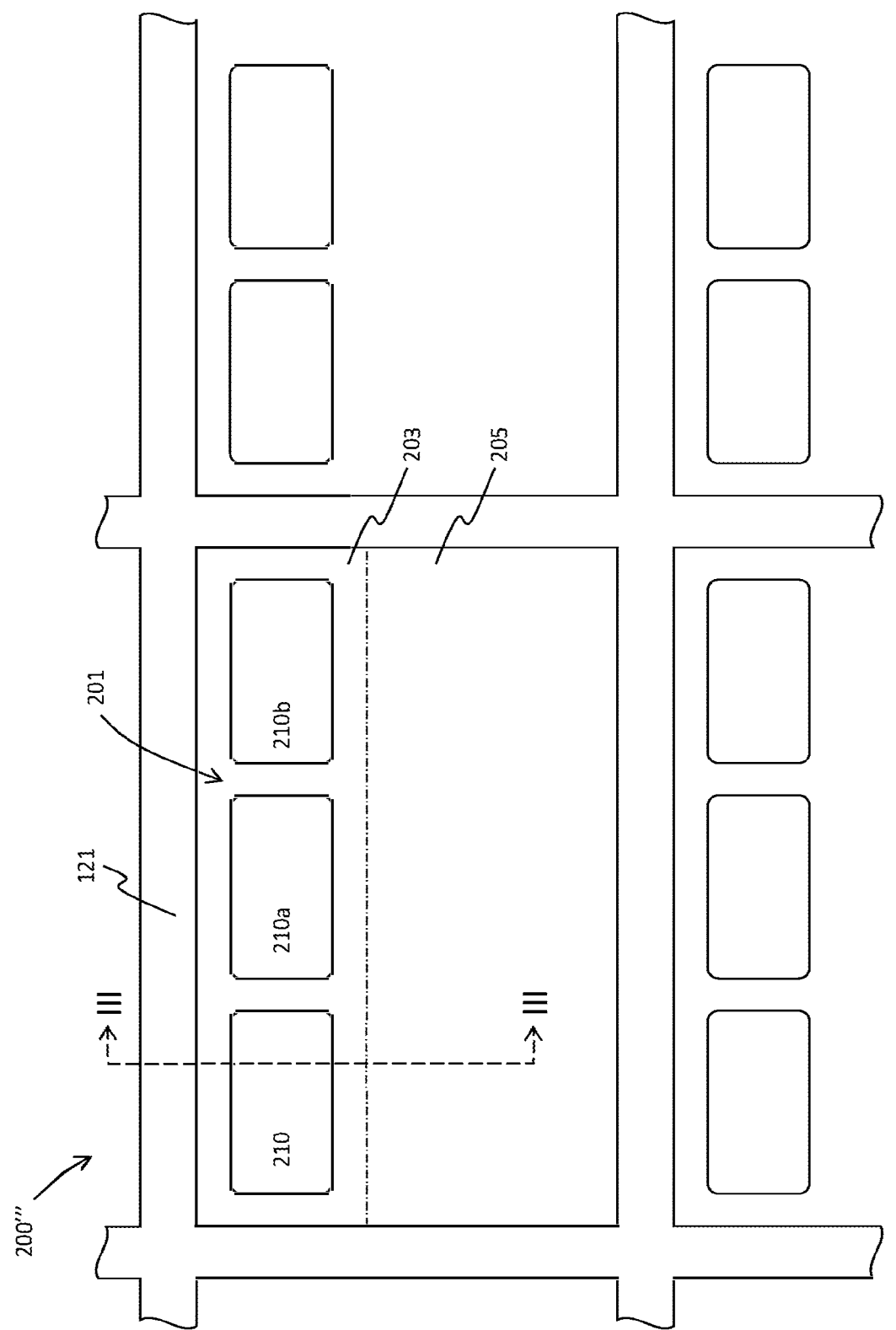
FIG. 16 is a schematic diagram illustrating a top view of a portion of an active matrix OLED device according to one embodiment.

FIG. 16 illustrates a portion of an AMOLED device 200‴ according to yet another embodiment wherein the AMOLED device 200‴ includes a plurality of light transmissive regions. As illustrated, the AMOLED device 200‴ includes a plurality of pixels 201 and an auxiliary electrode formed by a conductive coating 121 disposed between neighboring pixels 201. Each pixel 201 includes a subpixel region 203, which further includes a plurality of subpixels 210, 210a, 210b, and a light transmissive region 205. For example, the subpixel 210 may correspond to a red subpixel, the subpixel 210a may correspond to a green subpixel, and the subpixel 210b may correspond to a blue subpixel. As will be explained, the light transmissive region 205 is substantially transparent to allow light to pass through the device 200‴.

Figure 17:
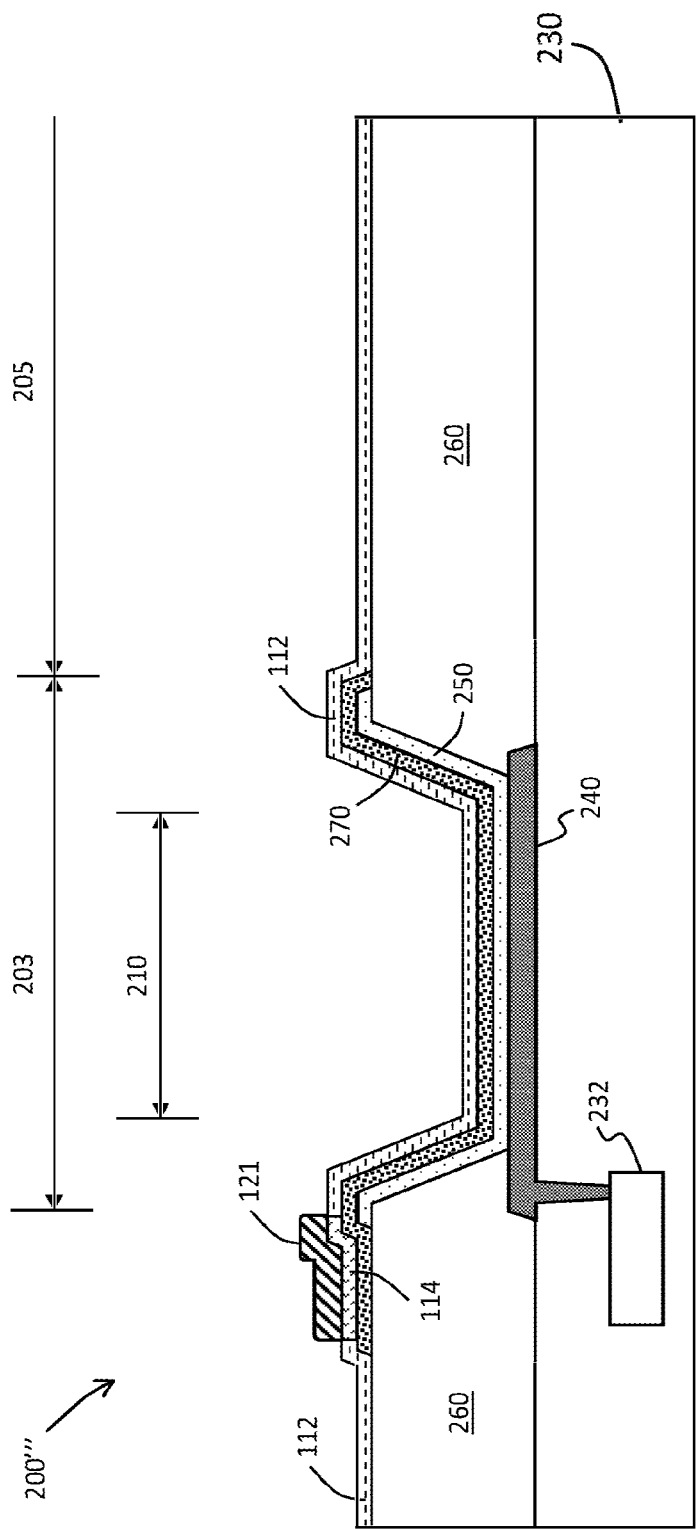
FIG. 17 is a schematic diagram illustrating a cross-sectional view of the active matrix OLED device according to the embodiment of FIG. 16.

FIG. 17 illustrates a cross-sectional view of the device 200‴ taken along line III-III as indicated in FIG. 16. Briefly, the device 200‴ includes a TFT substrate 230 having a TFT 232 formed therein, and a first electrode 240 (which may also be referred to as an anode) is formed on the TFT substrate 230. The anode 240 is in electrical communication with the TFT 232. A PDL 260 is formed on the TFT substrate 230 and covers edges of the anode 240. A semiconducting layer 250 is deposited to cover an exposed region of the anode 240 and portions of the PDL 260. A second electrode 270 (which may also be referred to as a cathode) is then deposited over the semiconducting layer 250. Next, a patterning coating is deposited to cover both an emissive region and a non-emissive region, including the light transmissive region 205 of the device 200‴. The patterning coating is then treated to form the first region 112 and the second region 114. Specifically in the illustrated embodiment, the first region 112 is disposed in the emissive region and the light transmissive region 205, while the second region 114 is disposed in a portion of the non-emissive region outside of the light transmissive region 205. For example, the second region 114 may correspond to the non-emissive region of the device 200''' wherein the second electrode 270 is provided, such that upon forming a conductive coating 121 thereon, the conductive coating 121 and the second electrode 270 may be electrically connected to each other. As explained above, by providing the first region 112 of the patterning coating exhibiting a lower affinity or initial sticking probability than the second region 114, the deposition of the conductive coating 121 in the emissive region or the light transmissive region 205 of the device 200''' is substantially inhibited. Therefore, the light transmissive region 205 is substantially free of any materials which may substantially affect the transmission of light therethrough. In particular, the TFT 232 and the conductive coating 121 are positioned outside the light transmissive region 205 such that these components do not attenuate or impede light from being transmitted through the light transmissive region 205. Such arrangement allows a viewer viewing the device 200''' from a typical viewing distance to see through the device 200''' when the pixels are off or are non-emitting, thus creating a transparent AMOLED display device. In some embodiments, the TFT 232 and/or the conductive coating 121 may be substantially transparent or light transmissive to allow light to also be transmitted through such components or elements.

In other embodiments, various layers or coatings, including the semiconducting layer 250 and the cathode 270, may cover a portion of the light transmissive region 205 if such layers or coatings are substantially transparent. Alternatively, or in conjunction, the PDL 260 may be omitted from the light transmissive region 205, if desired.

It will be appreciated that pixel and subpixel arrangements other than the arrangement illustrated in FIG. 16 may also be used, and the conductive coating 121 may be provided in other regions of a pixel. For example, the conductive coating 121 may be provided in the region between the subpixel region 203 and the light transmissive region 205, and/or be provided between neighboring subpixels, if desired.

Various embodiments of the conductive coating 121 formed according to the methods described above will now be described in further detail with reference to FIGS. 18 to 21. For example, various features of the conductive coating 121 described in relation to these figures may be applicable to, and may be combined with, various other embodiments of devices and methods described herein.

Figure 18:
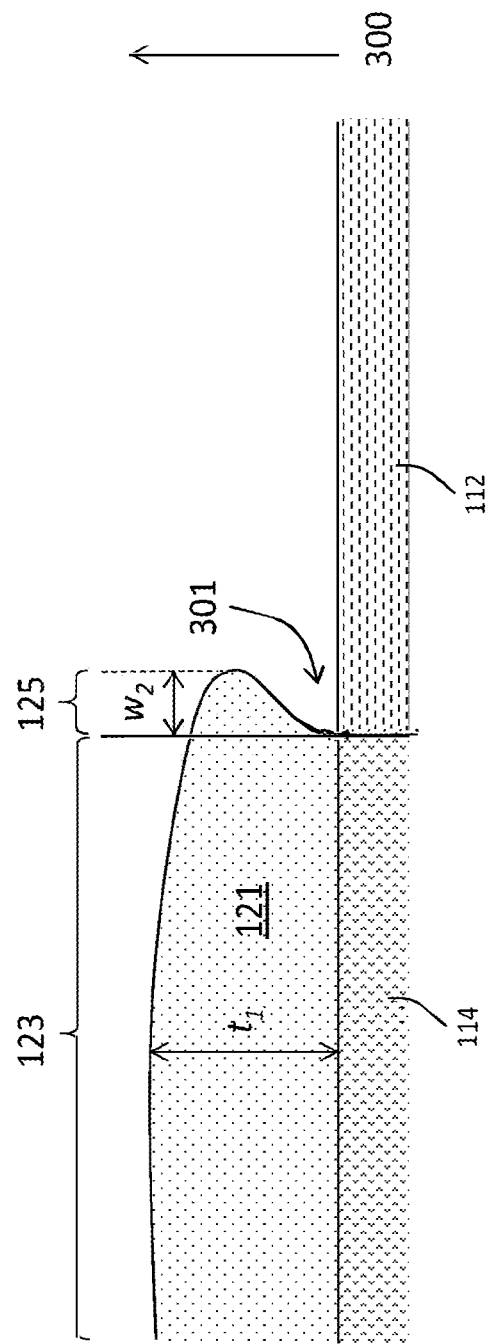
FIG. 18 is a schematic diagram illustrating a cross-sectional profile around an interface of a first region and a second region of a patterning coating according to one embodiment.

FIG. 18 illustrates a portion of a device according to one embodiment. The first region 112 and the second region 114 of the patterning coating are provided, and the conductive coating 121 is illustrated as being deposited over the second region 114. The conductive coating 121 includes a first portion 123 and a second portion 125. As illustrated, the first portion 123 of the conductive coating 121 covers the second region 114 of the patterning coating, and the second portion 125 of the conductive coating 121 partially overlaps a portion of the first region 112 of the patterning coating. Specifically, the second portion 125 is illustrated as overlapping the portion of the first region 112 in a direction that is perpendicular (or normal) to a surface onto which the patterning coating and the conductive coating 121 are deposited.

Particularly in the case where the first region 112 is formed such that its surface exhibits a relatively low affinity or initial sticking probability against a material used to form the conductive coating 121, there is a gap 301 formed between the overlapping, second portion 125 of the conductive coating 121 and the surface of the first region 112. Accordingly, the second portion 125 of the conductive coating 121 is not in direct physical contact with the first region 112, but is spaced from the first region 112 by the gap 301 along the direction perpendicular to the underlying surface, as indicated by arrow 300. Nevertheless, the first portion 123 of the conductive coating 121 may be in direct physical contact with the first region 112 at an interface or a boundary between the first region 112 and the second region 114 of the patterning coating. As illustrated the first portion 123 of the conductive coating 121 may be disposed over, and be in direct physical contact with, the second region 114 of the patterning coating.

In some embodiments, the overlapping, second portion 125 of the conductive coating 121 may laterally extend over the first region 112 by a comparable extent as a thickness of the conductive coating 121. For example, in reference to FIG. 18, a width $w_2$ (or a dimension along a direction parallel to the underlying surface) of the second portion 125 may be comparable to a thickness $t_1$ (or a dimension along a direction perpendicular to the underlying surface) of the first portion 123 of the conductive coating 121. For example, a ratio of $w_2$:$t_1$ may be in a range of about 1:1 to about 1:3, about 1:1 to about 1:1.5, or about 1:1 to about 1:2. While the thickness $t_1$ would generally be relatively uniform across the conductive coating 121, the extent to which the second portion 125 overlaps with the first region 112 (namely, $w_2$) may vary to some extent across different portions of the surface.

Figure 19:
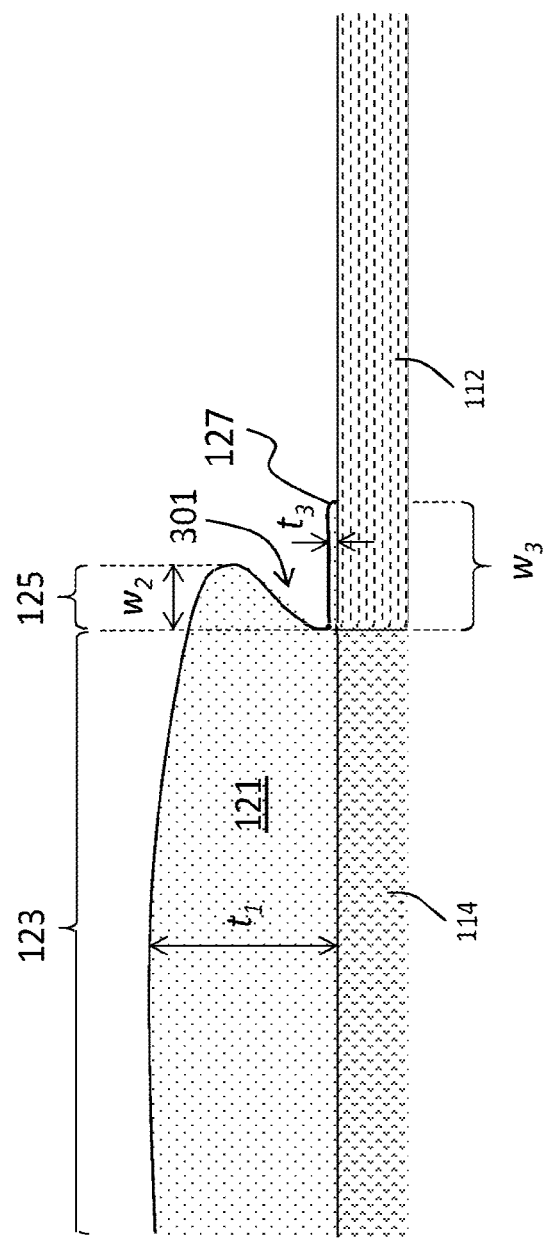
FIG. 19 is a schematic diagram illustrating a cross-sectional profile around an interface of a first region and a second region of a patterning coating according to one embodiment.

In another embodiment illustrated in FIG. 19, the conductive coating 121 further includes a third portion 127 disposed between the second portion 125 and the first region 112 of the patterning coating. As illustrated, the second portion 125 of the conductive coating 121 laterally extends over and is spaced from the third portion 127 of the conductive coating 121, and the third portion 127 may be in direct physical contact with the surface of the first region 112 of the patterning coating. A thickness $t_3$ of the third portion 127 may be less, and, in some cases, substantially less than the thickness $t_1$ of the first portion 123 of the conductive coating 121. Furthermore, at least in some embodiments, a width $w_3$ of the third portion 127 may be greater than the width $w_2$ of the second portion 125. Accordingly, the third portion 127 may extend laterally to overlap with the first region 112 to a greater extent than the second portion 125. For example, a ratio of $w_3$:$t_1$ may be in a range of about 1:2 to about 3:1 or about 1:1.2 to about 2.5:1. While the thickness $t_1$ would generally be relatively uniform across the conductive coating 121, the extent to which the third portion 127 overlaps with the first region 112 (namely, $w_3$) may vary to some extent across different portions of the surface. The thickness $t_3$ of the third portion 127 may be no greater than or less than about 5% of the thickness $t_1$ of the first portion 123. For example, $t_3$ may be no greater than or less than about 4%, no greater than or less than about 3%, no greater than or less than about 2%, no greater than or less than about 1%, or no greater than or less than about 0.5% of $t_1$. Instead of, or in addition to, the third portion 127 being formed as a thin film as shown in FIG. 19, the material of the conductive coating 121 may form as islands or disconnected clusters on a portion of the first region 112 of the patterning coating. For example, such islands or disconnected clusters may include features which are physically separated from one another, such that the islands or clusters are not formed as a continuous layer.

Figure 20:
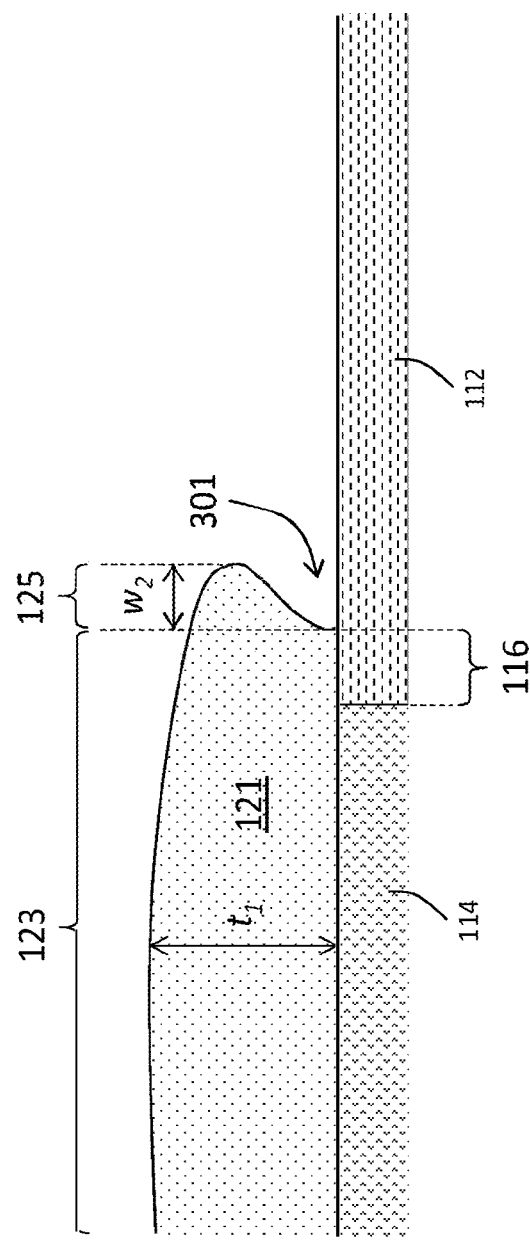
FIG. 20 is a schematic diagram illustrating a cross-sectional profile around an interface of a first region and a second region of a patterning coating according to one embodiment.

FIG. 20 illustrates a yet another embodiment in which the conductive coating 121 partially overlaps a portion of the first region 112 of the patterning coating. As illustrated, the first portion 123 of the conductive coating 121 is in direct physical contact with the surface of the first region 112 in the portion of the surface labelled 116. In this regard, the overlap in the portion 116 may be formed as a result of lateral growth of the conductive coating 121 during an open mask or mask-free deposition process. More specifically, while the surface of the first region 112 may exhibit a relatively low initial sticking probability for the material of the conductive coating 121 and thus the probability of the material nucleating on such surface is low, as the conductive coating 121 grows in thickness, the coating 121 may also grow laterally and may cover the portion 116 of the first region 112 as illustrated in FIG. 20. In such embodiment, the conductive coating 121 may be disposed over, and be in direct physical contact with, the second region 114 as well as the overlap portion 116 of the first region 112 of the patterning coating.

Referring to the embodiments illustrated in FIGS. 12, 15 and 18-20, when the conductive coating 121 is formed in an AMOLED device, the second portion 125 and/or the third portion 127 of the conductive coating 121 may be provided in the buffer region 215 of such device. Additionally or alternatively, the overlap portion 116 may be provided in the buffer region 215.

It has been observed that, at least in some cases, conducting the open mask or mask-free deposition of the conductive coating 121 over a treated surface of the patterning coating can result in the formation of the conductive coating 121 exhibiting a tapered cross-sectional profile at or near the interface between the conductive coating 121 and the first region 112 of the patterning coating.

Figure 21:
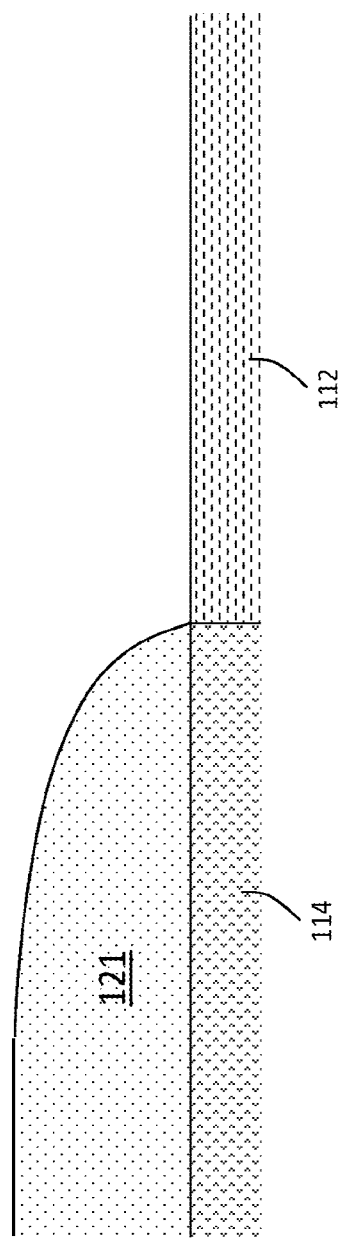
FIG. 21 is a schematic diagram illustrating a cross-sectional profile around an interface of a first region and a second region of a patterning coating according to one embodiment.

FIG. 21 illustrates one embodiment in which the thickness of the conductive coating 121 is reduced at, near, or adjacent to the interface between the conductive coating 121 and the first region 112 due to the tapered profile of the conductive coating 121. Specifically, the thickness of the conductive coating 121 at or near the interface is less than the average thickness of the conductive coating 121. While the tapered profile of the conductive coating 121 is illustrated as being curved or arched (e.g., with a convex shape) in the embodiment of FIG. 21, the profile may be substantially linear or non-linear (e.g., with a concave shape) in other embodiments. For example, the thickness of the conductive coating 121 may decrease in substantially linear, exponential, quadratic, or other manner in the region proximal to the interface.

A barrier coating (not shown) may be provided to encapsulate the devices illustrated in the foregoing embodiments depicting AMOLED display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, CVD, sputtering, atomic layer deposition (ALD), any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

Various layers and portions of a frontplane, including electrodes, the semiconducting layers, the pixel definition layer, the patterning coating and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink jet printing, vapor jet printing, screen printing, and reel-to-reel printing), OVPD, and LITI patterning.

Suitable materials for use to form a patterning coating include those exhibiting or characterized as having an initial sticking probability for a material of a conductive coating of no greater than or less than about 0.1 (or 10%) or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001 in its "low affinity" state, and in addition, exhibiting or characterized as having an initial sticking probability for a material of a conductive coating of at least about 0.2 (or 20%), at least about 0.4 (or 40%), at least about 0.6 (or 60%), at least about 0.7, at least about 0.75, at least about 0.8, at least about 0.9, at least about 0.93, at least about 0.95, at least about 0.98, or at least about 0.99 in its "high affinity" state.

In some embodiments, it may be particularly advantageous to use a patterning coating material wherein the initial sticking coefficient of the material in the "high affinity" state is greater than about 2 times, greater than about 5 times, greater than about 10 times, greater than about 15 times, greater than about 20 times, greater than about 30 times, greater than about 50 times, or greater than about 100 times the initial sticking coefficient in the "low affinity" state to achieve selective deposition of a conductive coating. For example, in embodiments wherein a treated second region of a patterning coating has a higher affinity or initial sticking probability than an untreated first region of the patterning coating, an initial deposition rate of the evaporated conductive material on the treated second region may be at least or greater than about 80 times, at least or greater than about 100 times, at least or greater than about 200 times, at least or greater than about 500 times, at least or greater than about 700 times, at least or greater than about 1000 times, at least or greater than about 1500 times, at least or greater than about 1700 times, or at least or greater than about 2000 times an initial deposition rate of the evaporated conductive material on the surface of untreated first region.

In some embodiments, suitable materials for use to form a patterning coating include aromatic compounds. Examples of suitable aromatic compounds include polycyclic aromatic compounds including organic molecules which may optionally include one or more heteroatoms, such as nitrogen (N), sulfur (S), oxygen (O), phosphorus (P), fluorine (F), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety. In some embodiments, at least one terminal moiety is, or includes, a biphenylyl moiety. In some embodiments, at least one terminal moiety is, or includes, a phenyl moiety. In some embodiments, at least one terminal moiety is, or includes, a tert-butylphenyl moiety. In some embodiments, at least one terminal moiety is, or includes, a cyclic or polycyclic aromatic moiety. An example of a polycyclic aromatic compound is TAZ, which refers to 3-(4-biphenyl)-4-phenyl-5-tert-butylphenyl-1,2,4-triazole.

It will be appreciated that features described in various embodiments may also be applicable to, and be combined with other features described in other embodiments. Unless a context clearly indicates otherwise, it will also be appreciated that features, components, and/or elements described in singular forms may also be provided in plural forms and vice versa.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. A device having a plurality of layers, extending substantially transverse to a lateral aspect of the device, wherein the layers comprise:
a patterning coating extending across a first region and a second region of the lateral aspect of an underlying surface, the patterning coating having a first initial sticking probability in the first region and a second initial sticking probability, that exceeds the first initial sticking probability, in the second region; and
a conductive coating supported by the patterning coating and extending across the second region only;
wherein the conductive coating is a closed coating formed by actions comprising:
depositing a patterning coating material across both the first region and the second region to form the patterning coating;
treating the patterning coating to change its initial sticking probability against deposition of a conductive coating material in one of the first and second regions from a first value to a second value, such that the initial sticking probability in the second region exceeds the initial sticking probability in the first region; and
subjecting the conductive coating to a vapor flux of the conductive coating material; wherein the conductive coating forms primarily in, and across substantially all of, the second region.

2. The device of claim 1, wherein the patterning coating comprises a single layer integrally formed across the first and second region.

3. The device of claim 1, wherein the conductive coating is in direct contact with the patterning coating in the second region.

4. The device of claim 1, wherein the action of treating causes at least one of: a form, and a composition, of a first patterning coating material comprising the patterning coating material in the first region to be different than a second patterning coating material comprising the patterning coating material in the second region.

5. The device of claim 4, wherein the first patterning material has a first degree of crystallinity and the second patterning material has a second degree of crystallinity that exceeds the first degree of crystallinity.

6. The device of claim 5, wherein a concentration of an oxygen species of the second patterning coating material exceeds a concentration of an oxygen species of the first patterning material.

7. The device of claim 5, wherein an average molecular weight of the first patterning material is less than an average molecular weight of the second patterning material.

8. The device of claim 5, wherein the second patterning material is polymerized.

9. The device of claim 4, wherein the action of treating comprises an action of applying electromagnetic radiation to one of the first and second patterning materials.

10. The device of claim 9, wherein the action of applying uses at least one of a mask and a laser.

11. The device of claim 9, wherein the electromagnetic radiation is selected from ultraviolet radiation and extreme ultraviolet radiation.

12. The device of claim 9, wherein a wavelength of the electromagnetic radiation substantially matches an absorption wavelength of the exposed one of the first and second patterning materials.

13. The device of claim 1, wherein the action of depositing comprises an action of exposing the underlying surface to a vapor flux of the patterning coating material.

14. The device of claim 1, wherein the action of depositing comprises an action of positioning a mask to limit a lateral extent of the deposition of the patterning coating.

15. The device of claim 1, wherein the action of subjecting comprises presenting both the first region and the second region to the vapor flux of the conductive coating material.

16. The device of claim 1, wherein the action of subjecting is performed in at least one of an open-mask and maskless deposition.

17. The device of claim 1, wherein the first region is substantially devoid of a closed coating of the conductive coating material.

18. The device of claim 1, wherein the layers further comprise at least one island disposed on a surface of the patterning coating in the first region.

19. The device of claim 18, wherein the at least one island is formed during the action of subjecting.

20. The device of claim 18, wherein the at least one island forms a disconnected cluster.

21. The device of claim 18, wherein the at least one island comprises other than a continuous layer.

22. The device of claim 18, wherein the at least one island is formed of the conductive coating material.

23. The device of claim 18, wherein a thickness of the at least one island is no greater than 5% of a thickness of the conductive coating in the second region.

24. The device of claim 18, wherein the conductive coating comprises a first portion covering the second region and a second portion partially overlapping the patterning coating, wherein the second portion is spaced from the patterning coating by a gap.

25. The device of claim 24, wherein the second portion extends over the at least one island and is spaced therefrom.

26. The device of claim 24, wherein another portion of the patterning coating is exposed from the conductive coating.

27. The device of claim 1, wherein the conductive coating material comprises magnesium.

28. The device of claim 1, wherein the conductive coating material comprises a high vapor pressure material.

29. The device of claim 28, wherein the high vapor pressure material is selected from at least one of ytterbium, cadmium and zinc.

30. The device of claim 1, further comprising an action of removing the patterning coating after the action of subjecting.

31. The device of claim 1, wherein the initial sticking probability in the first region after the action of treating is less than at least one of about: 0.1, 0.05, 0.03, 0.02, 0.01, 0.008, 0.005, 0.003, 0.001, 0.0008, 0.0005, and 0.0001.

32. The device of claim 1, wherein the initial sticking probability in the second region after the action of treating is at least about at least one of about: 0.2, 0.4, 0.6, 0.7, 0.75, 0.8, 0.9, 0.93, 0.95, 0.98, and 0.99.

33. The device of claim 1, wherein the patterning coating comprises a polycyclic aromatic compound.

34. The device of claim 1, wherein the patterning coating comprises an organic compound including a core moiety and a terminal moiety bonded to the core moiety.

35. The device of claim 1, wherein the device is an opto-electronic device.

36. The device of claim 35, wherein the device is an organic light emitting device.

37. The device of claim 36, wherein the underlying surface comprises an emissive region and a non-emissive region.

38. The device of claim 37, wherein the emissive region is adjacent to the non-emissive region.

39. The device of claim 37, wherein the layers further comprise, in the emissive region, a first electrode, a second electrode, and at least one semiconducting layer extending between the first and second electrode.

40. The device of claim 39, wherein the second electrode extends in both the emissive region and the non-emissive region.

41. The device of claim 39, wherein the second electrode extends between the at least one semiconducting layer and the patterning coating.

42. The device of claim 39, wherein the patterning coating is in direct contact with the second electrode.

43. The device of claim 39, wherein the layers further comprise a substrate comprising at least one thin film transistor electrically coupled to the first electrode, wherein the first electrode extends between the substrate and the at least one semiconducting layer.

44. The device of claim 39, wherein the emissive region lies within the first region and the non-emissive region lies within the second region.

45. The device of claim 44, wherein the conductive coating comprises an auxiliary electrode electrically coupled to the second electrode.

46. The device of claim 44, wherein a sheet resistance of the conductive coating is less than a sheet resistance of the second electrode.

* * * * *